(12) United States Patent
Yu et al.

(10) Patent No.: US 12,237,396 B2
(45) Date of Patent: Feb. 25, 2025

(54) P-METAL GATE FIRST GATE REPLACEMENT PROCESS FOR MULTIGATE DEVICES

(71) Applicant: Taiwan Semiconductor Manufacturing Co., Ltd., Hsin-Chu (TW)

(72) Inventors: Jia-Ni Yu, New Taipei (TW);
Kuo-Cheng Chiang, Hsinchu (TW);
Lung-Kun Chu, New Taipei (TW);
Chung-Wei Hsu, Hsinchu (TW);
Chih-Hao Wang, Hsinchu (TW);
Mao-Lin Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 206 days.

(21) Appl. No.: 17/874,031

(22) Filed: Jul. 26, 2022

(65) Prior Publication Data
US 2022/0359725 A1 Nov. 10, 2022

Related U.S. Application Data

(62) Division of application No. 16/834,637, filed on Mar. 30, 2020, now Pat. No. 11,594,614.

(51) Int. Cl.
*H01L 29/78* (2006.01)
*H01L 21/8238* (2006.01)
(Continued)

(52) U.S. Cl.
CPC ............ *H01L 29/66545* (2013.01); *H01L 21/823807* (2013.01); *H01L 21/823821* (2013.01);
(Continued)

(58) Field of Classification Search
None
See application file for complete search history.

(56) References Cited

U.S. PATENT DOCUMENTS

| 2014/0004693 | A1  | 1/2014 | Hoon |
| 2016/0240534 | A1* | 8/2016 | Murthy ............... H01L 21/3065 |
| 2020/0035567 | A1* | 1/2020 | Chanemougame ... H01L 29/401 |

FOREIGN PATENT DOCUMENTS

| CN | 107464840 A | 12/2017 |
| CN | 109524468 A | 3/2019 |

(Continued)

*Primary Examiner* — Joseph C. Nicely
*Assistant Examiner* — Lamont B Koo
(74) *Attorney, Agent, or Firm* — HAYNES AND BOONE, LLP

(57) ABSTRACT

Multi-gate devices and methods for fabricating such are disclosed herein. An exemplary method includes forming a gate dielectric layer around first channel layers in a p-type gate region and around second channel layers in an n-type gate region. Sacrificial features are formed between the second channel layers in the n-type gate region. A p-type work function layer is formed over the gate dielectric layer in the p-type gate region and the n-type gate region. After removing the p-type work function layer from the n-type gate region, the sacrificial features are removed from between the second channel layers in the n-type gate region. An n-type work function layer is formed over the gate dielectric layer in the n-type gate region. A metal fill layer is formed over the p-type work function layer in the p-type gate region and the n-type work function layer in the n-type gate region.

20 Claims, 24 Drawing Sheets

(51) Int. Cl.
*H01L 27/092* (2006.01)
*H01L 29/66* (2006.01)

(52) U.S. Cl.
CPC ........... *H01L 21/823842* (2013.01); *H01L 21/823857* (2013.01); *H01L 27/0924* (2013.01); *H01L 29/66795* (2013.01); *H01L 29/7855* (2013.01)

(56) References Cited

FOREIGN PATENT DOCUMENTS

| | | | |
|---|---|---|---|
| CN | 109755119 | A | 5/2019 |
| CN | 110729191 | A | 1/2020 |
| KR | 20190031855 | A | 3/2019 |

\* cited by examiner

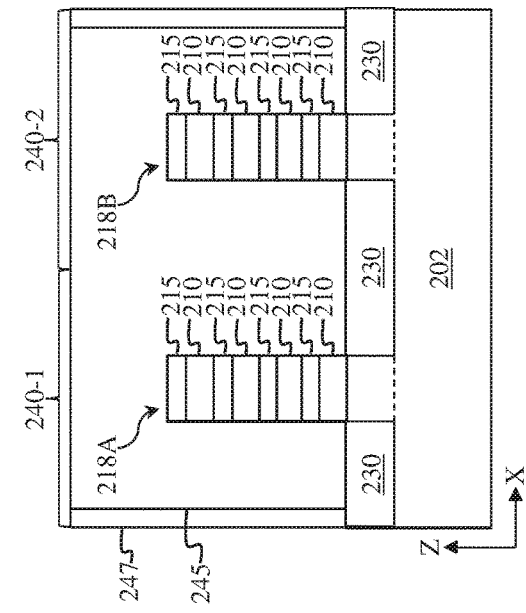
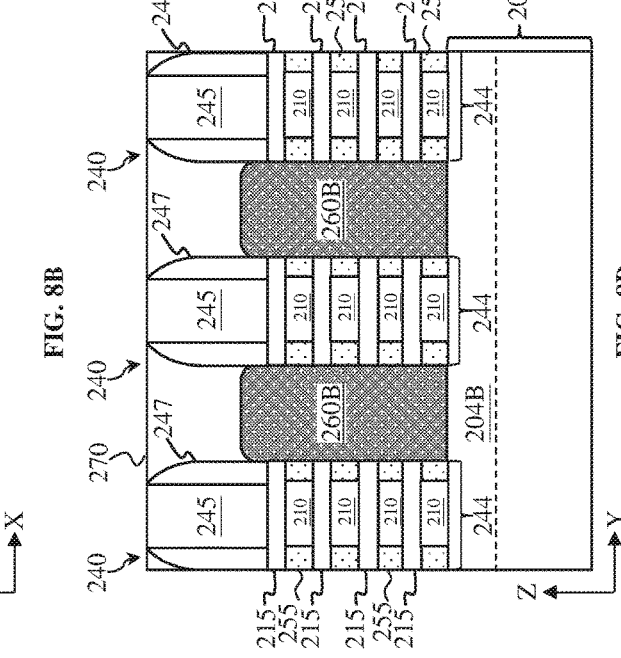
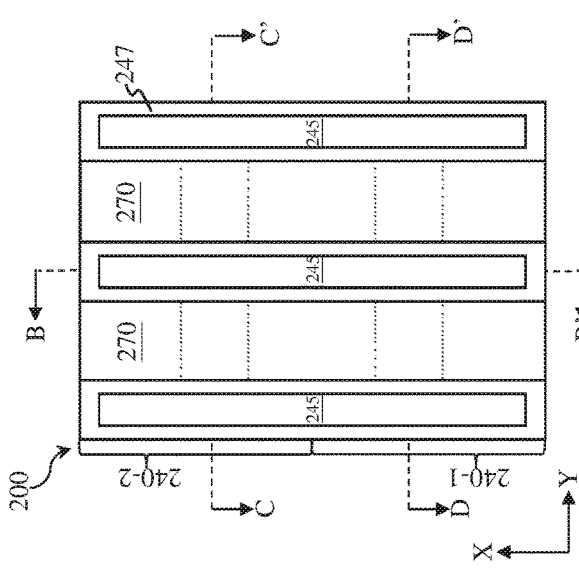
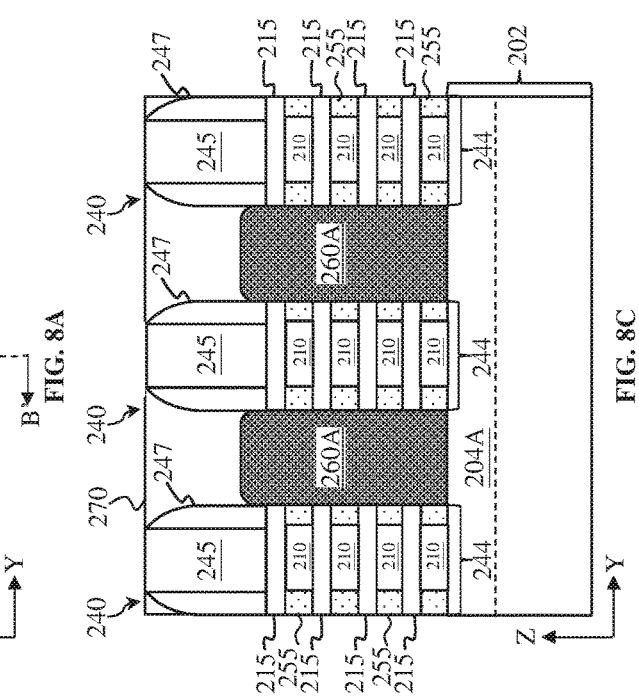

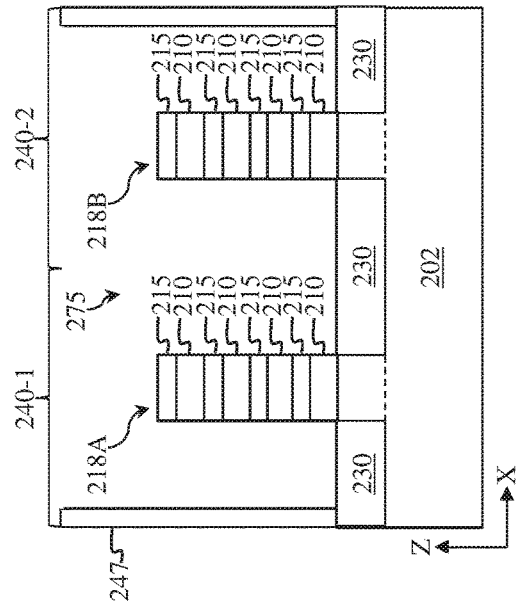
FIG. 9B
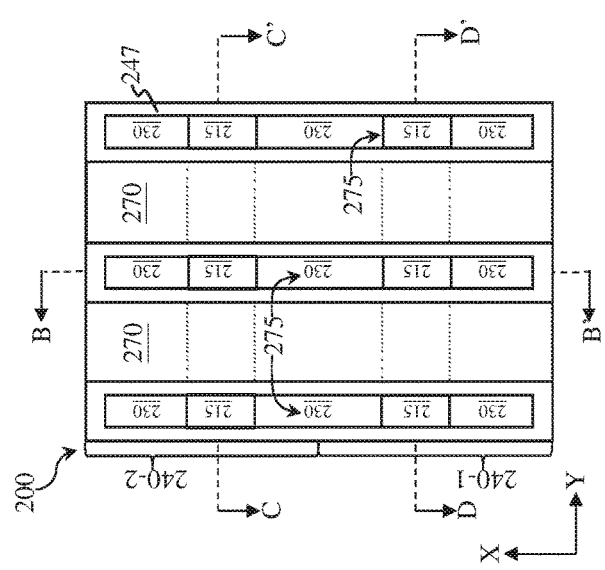
FIG. 9A
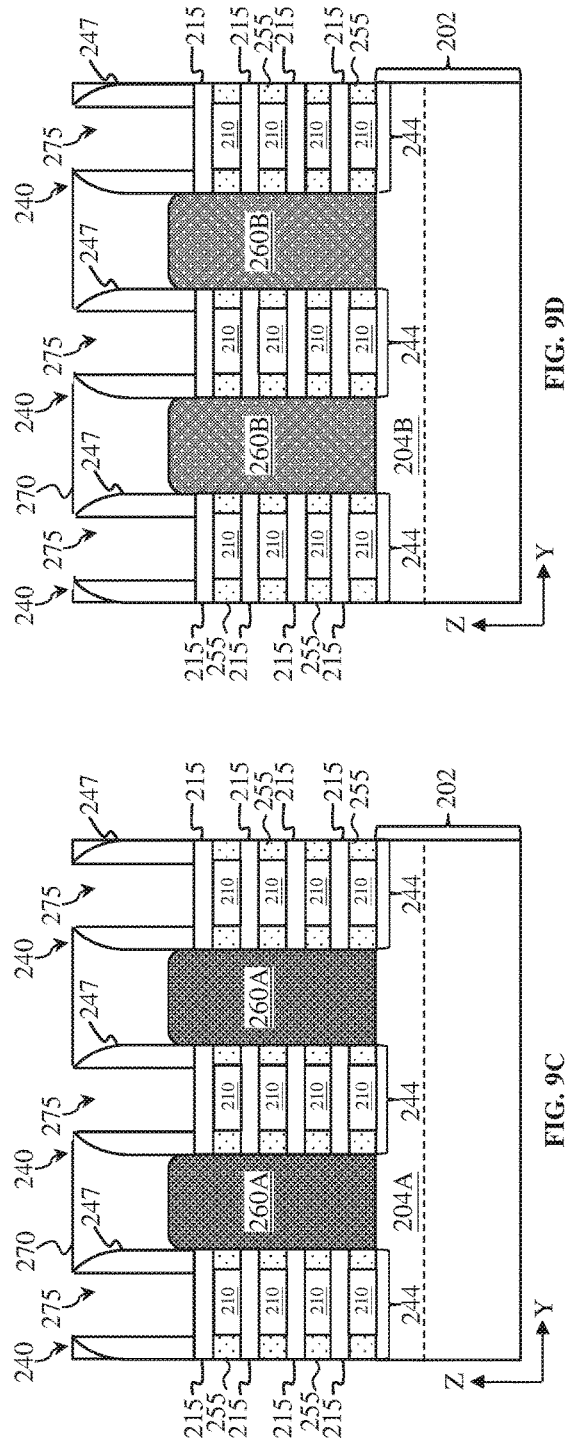
FIG. 9D
FIG. 9C

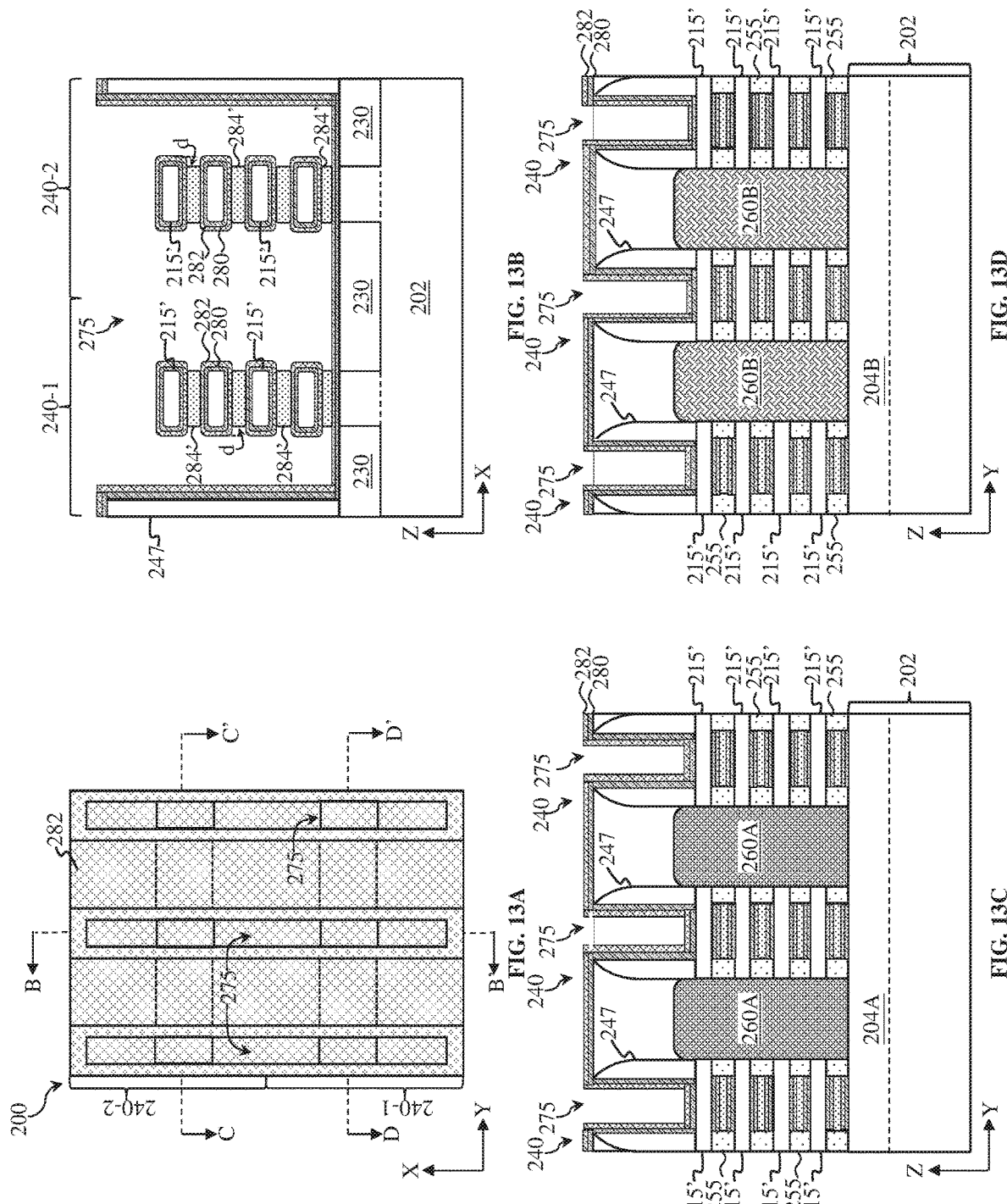

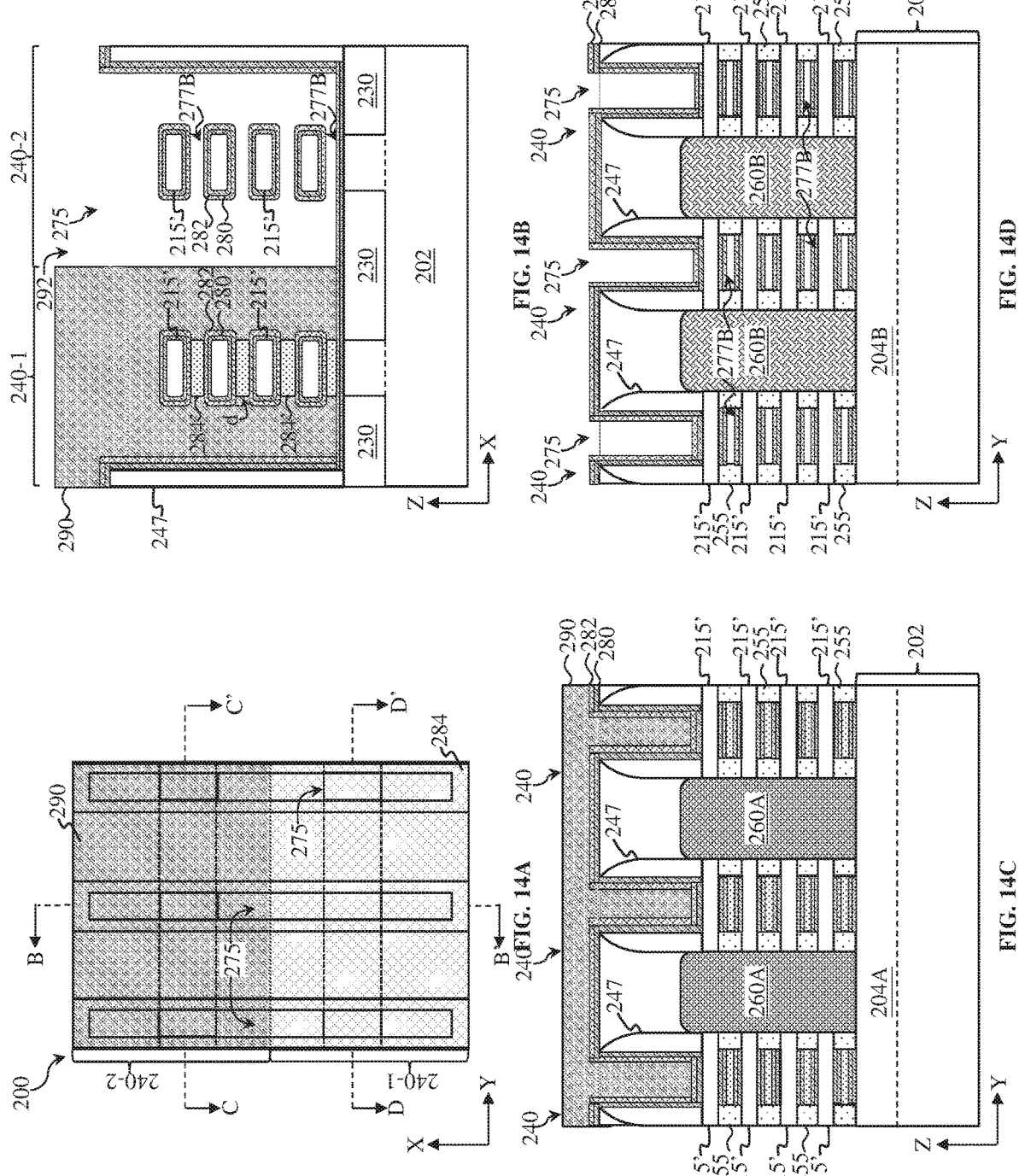

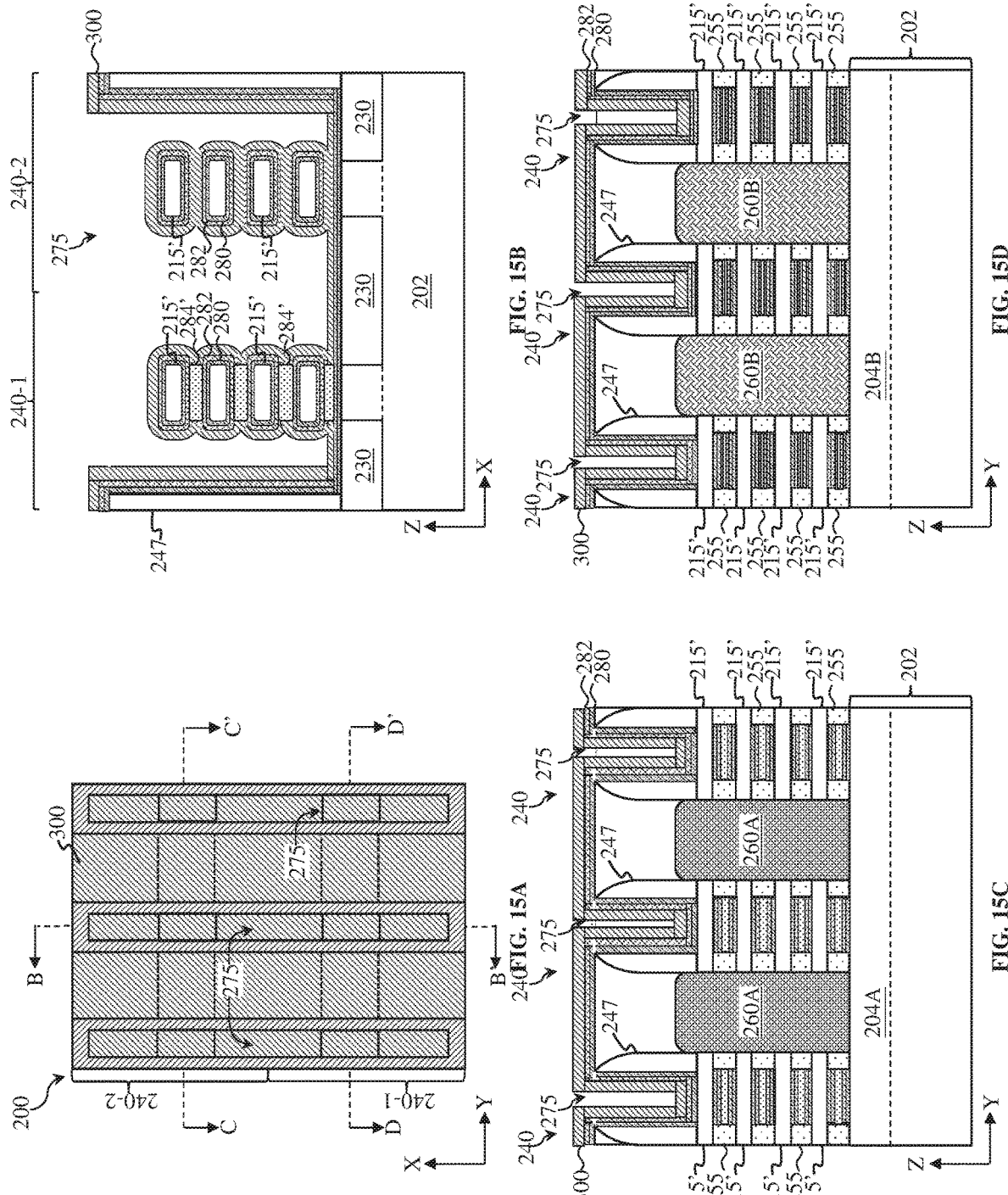

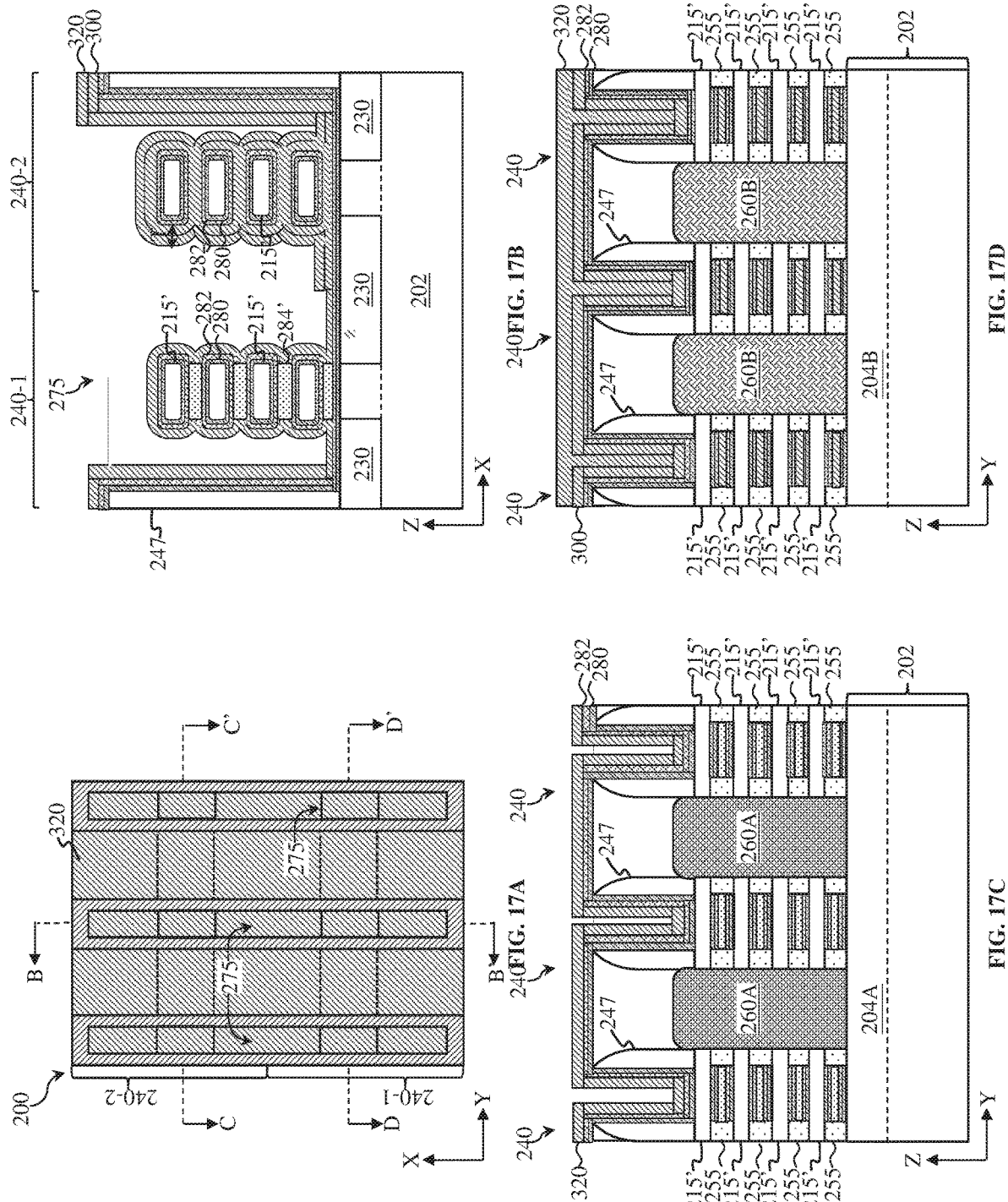

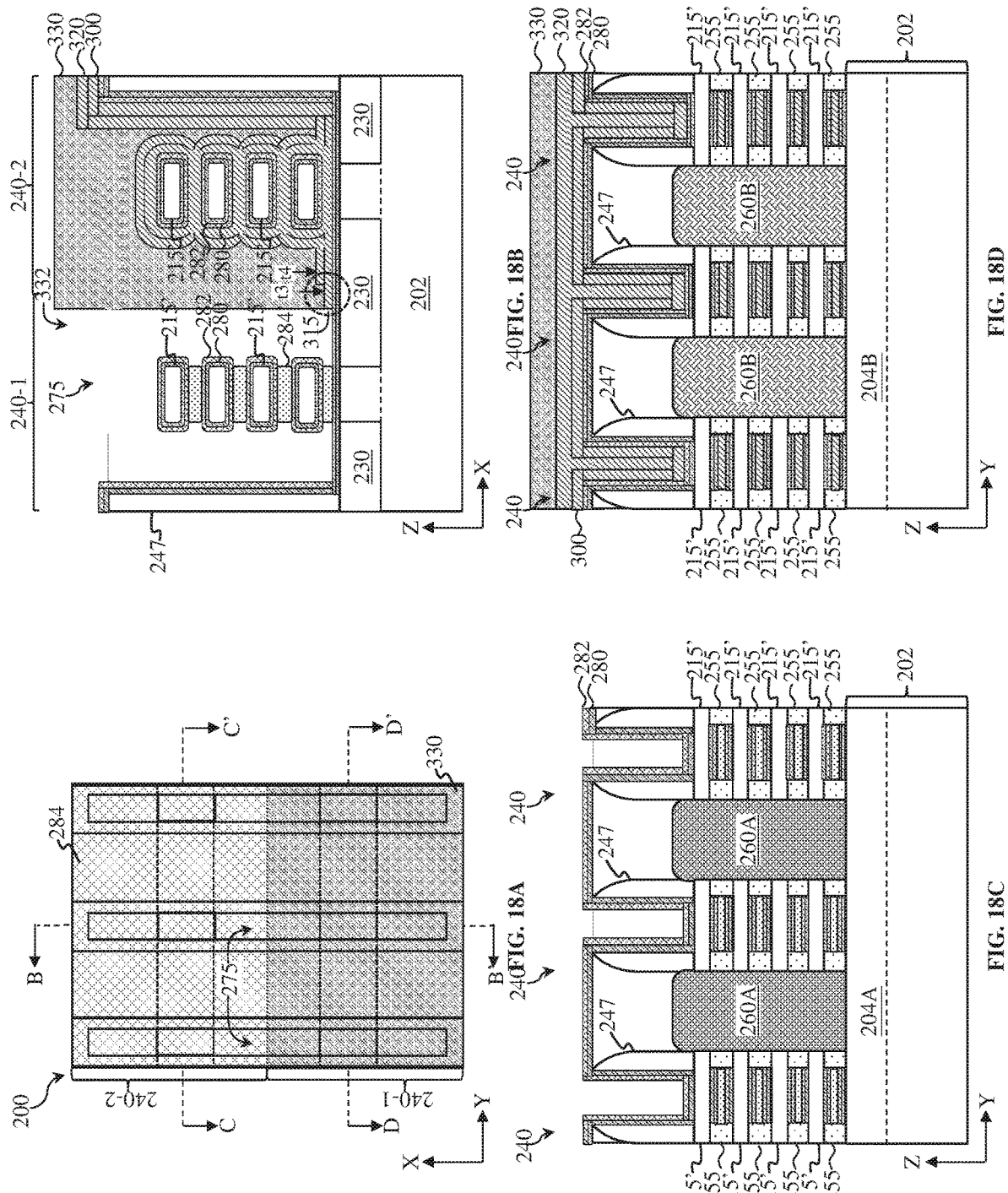

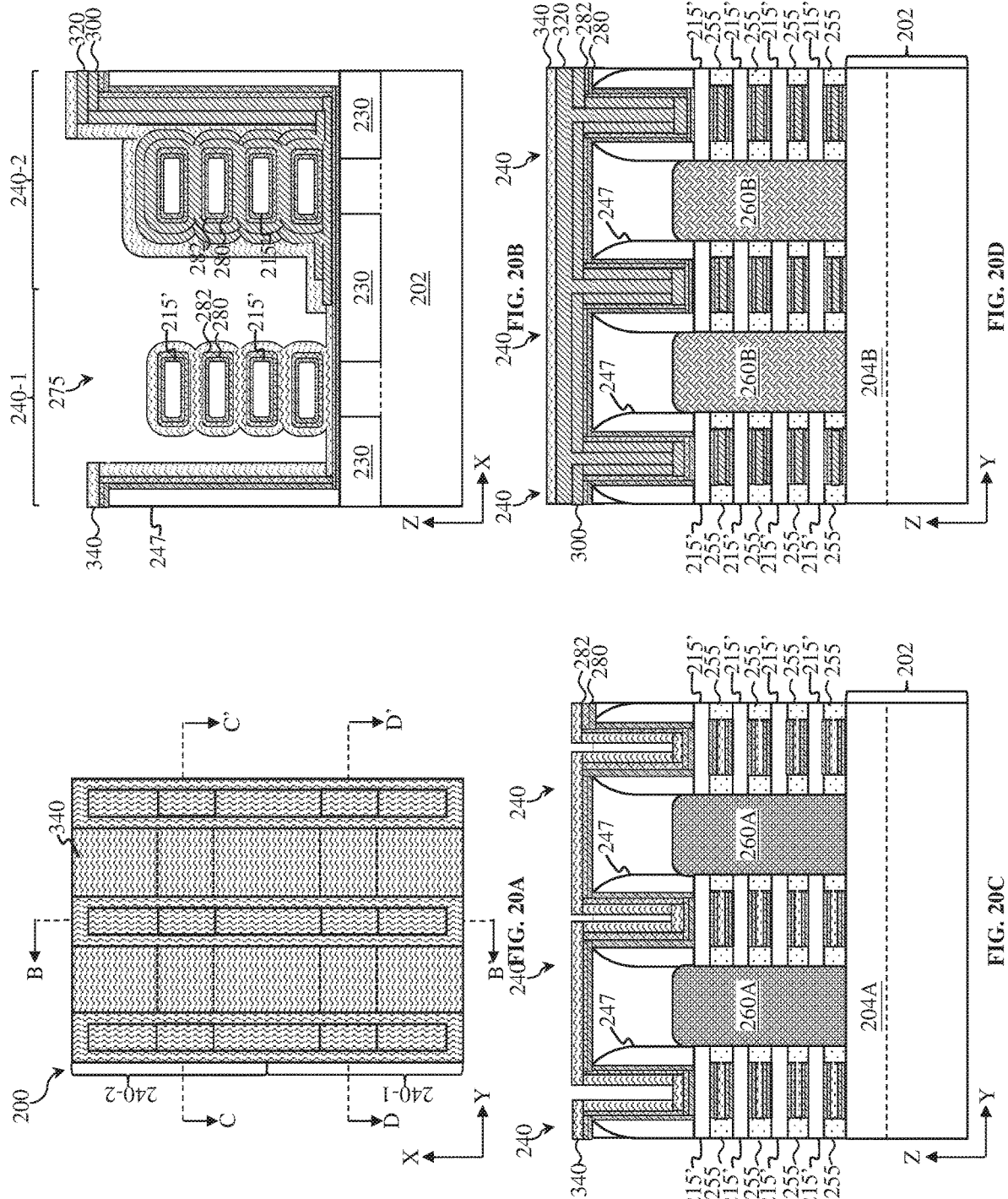

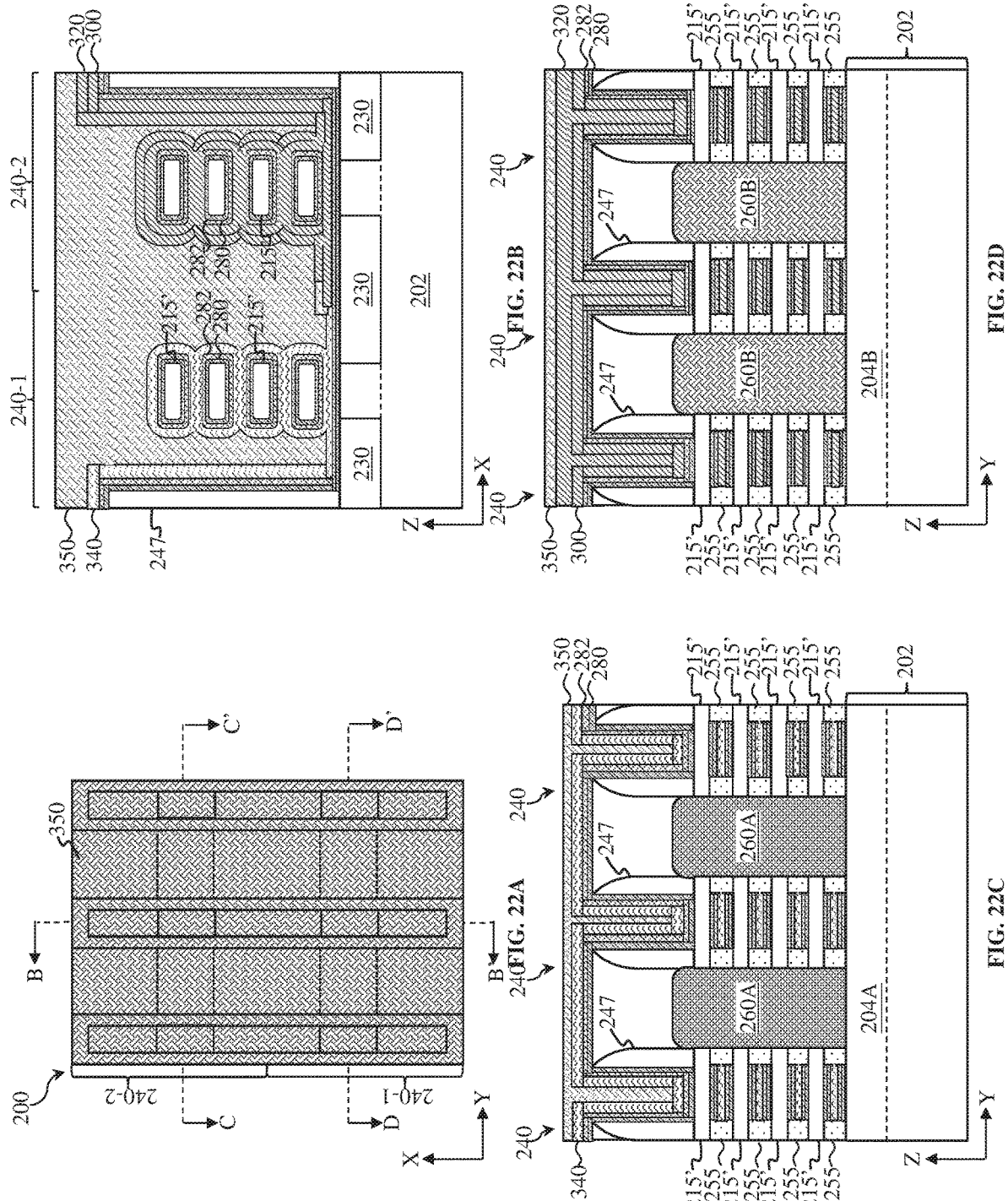

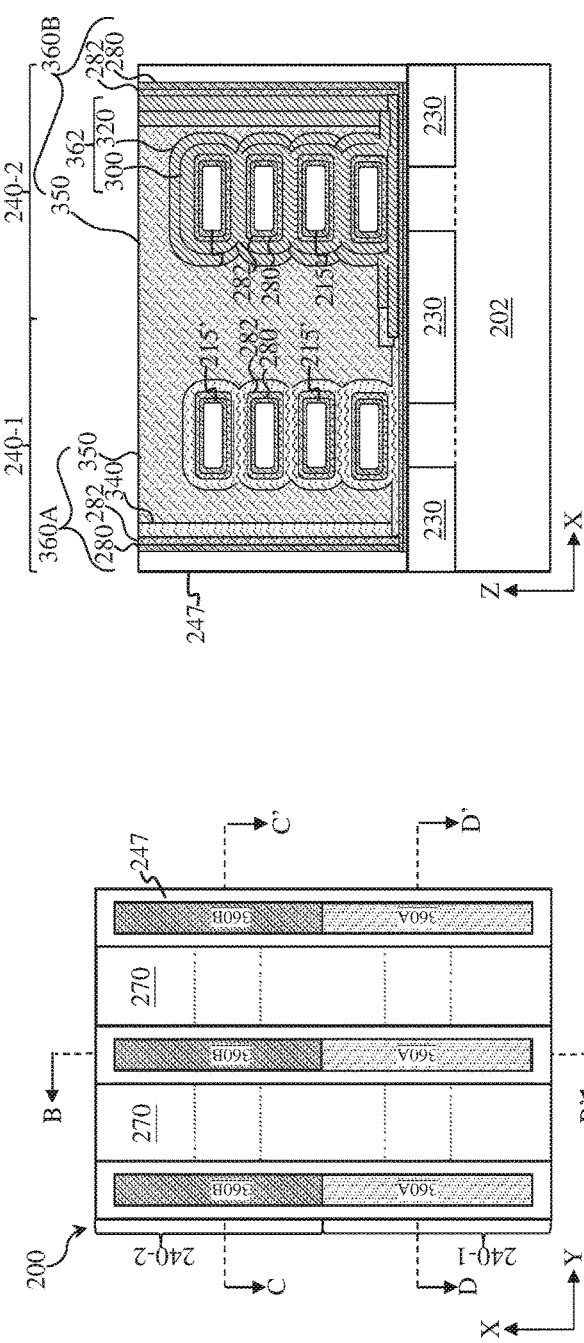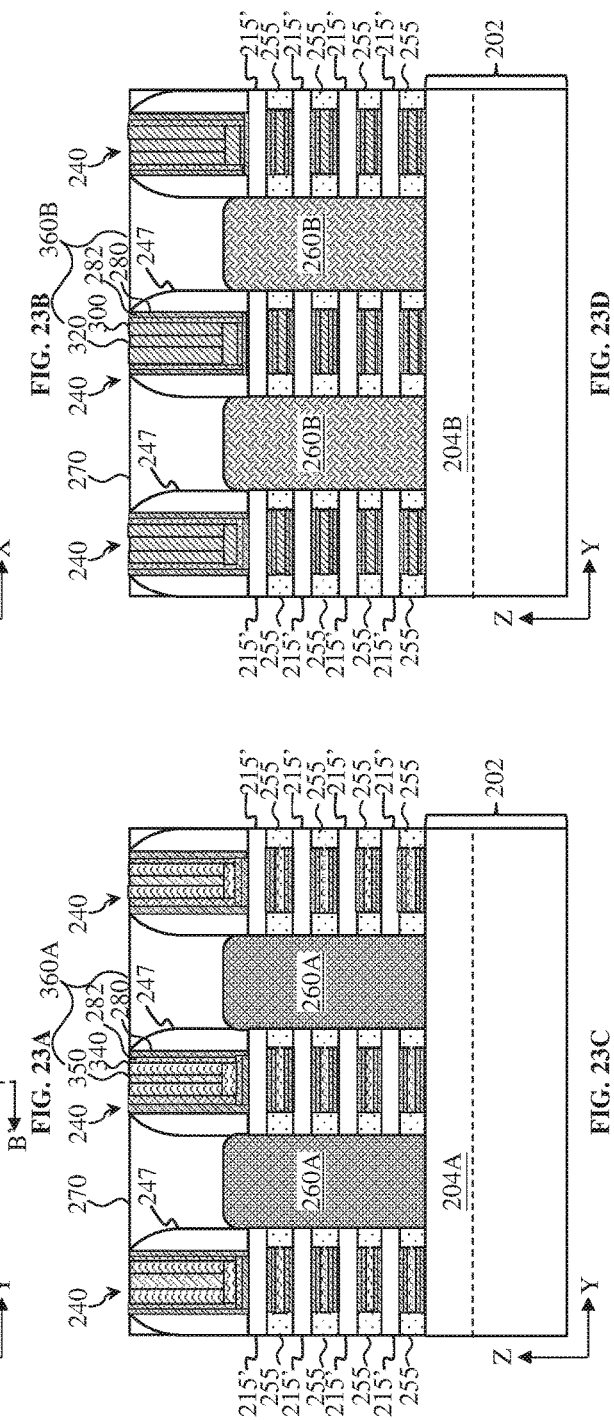

P-METAL GATE FIRST GATE REPLACEMENT PROCESS FOR MULTIGATE DEVICES

This application is a divisional application of U.S. patent application Ser. No. 16/834,637, filed Mar. 30, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when fabricating a gate structure for a GAA device that includes an n-metal gate that shares a boundary with a p-metal gate, which challenges have been observed to degrade GAA device performance and increase GAA processing complexity. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-23A, FIGS. 2B-23B, FIGS. 2C-23C, and FIGS. 2D-23D are fragmentary diagrammatic views of a multigate device, in portion or entirety, at various fabrication stages (such as those associated with the method in FIG. 1A and FIG. 1B) according to various aspects of the present disclosure.

DETAILED DESCRIPTION

Figure 1A:
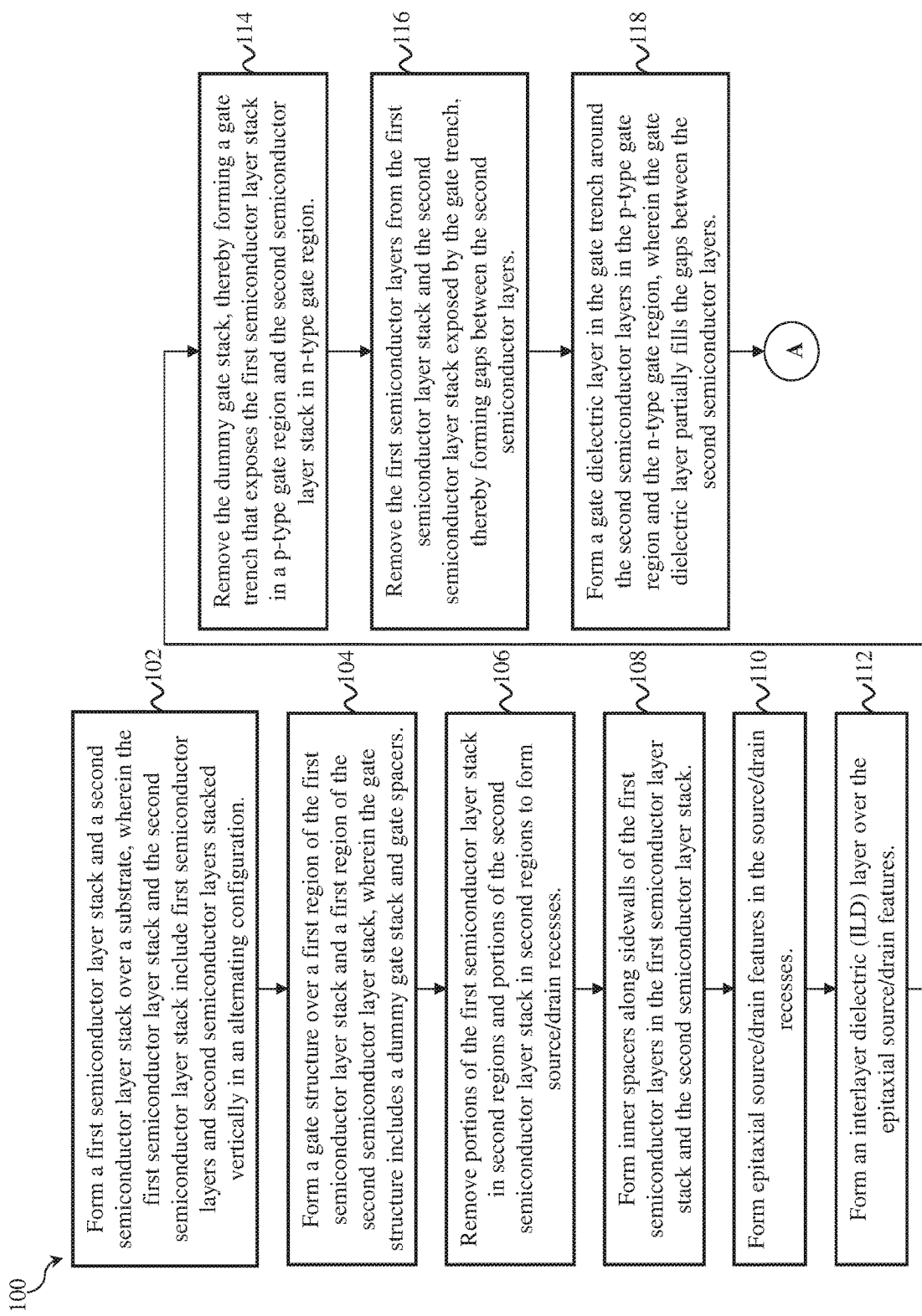
FIG. 1A and FIG. 1B are a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

Figure 1B:
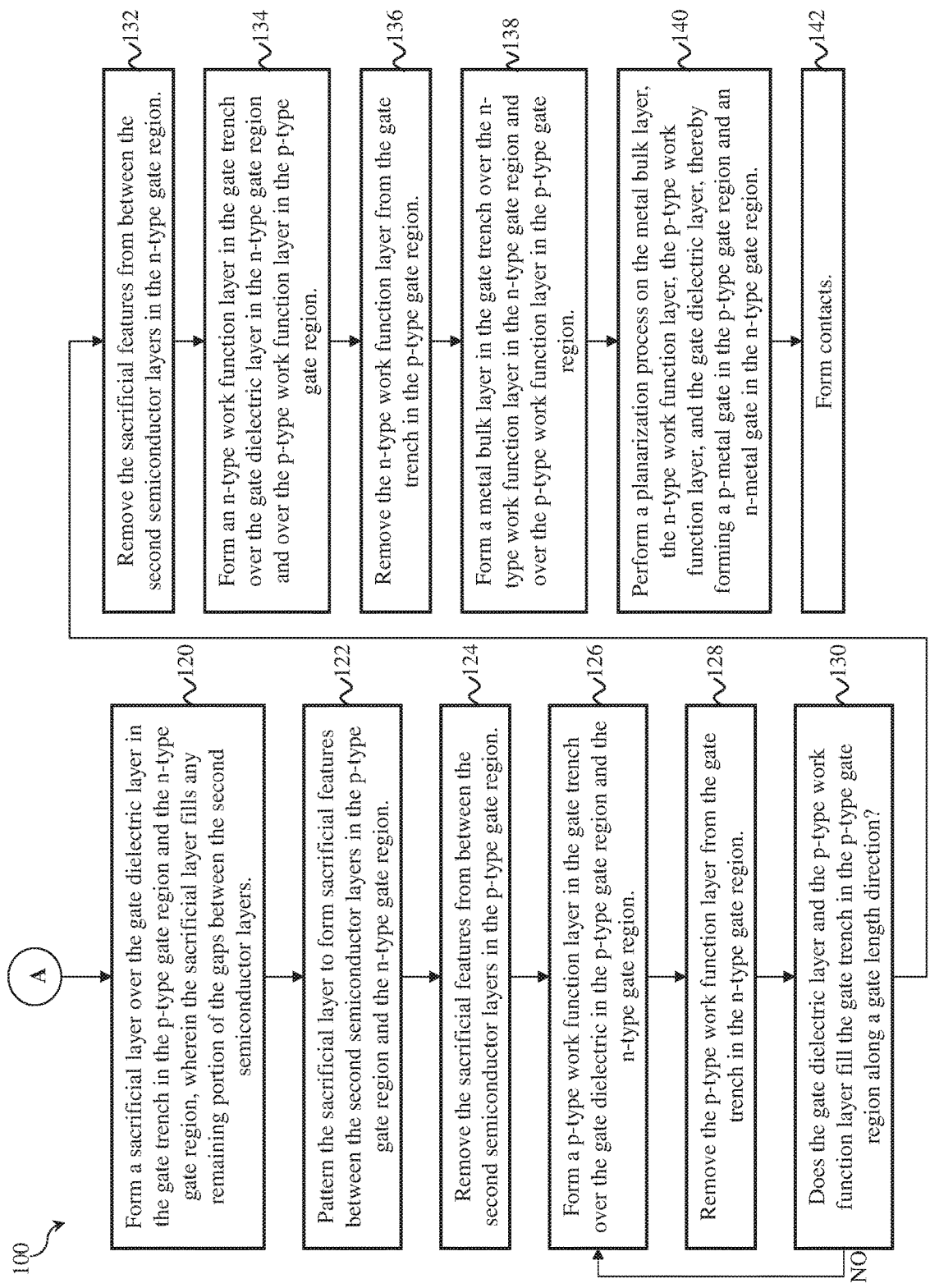
Figure 2A:
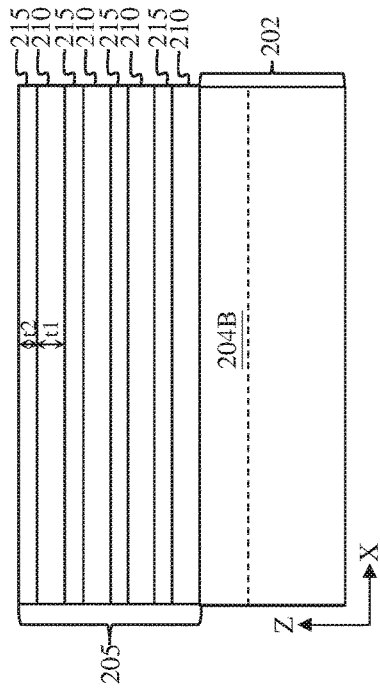
Figure 2B:
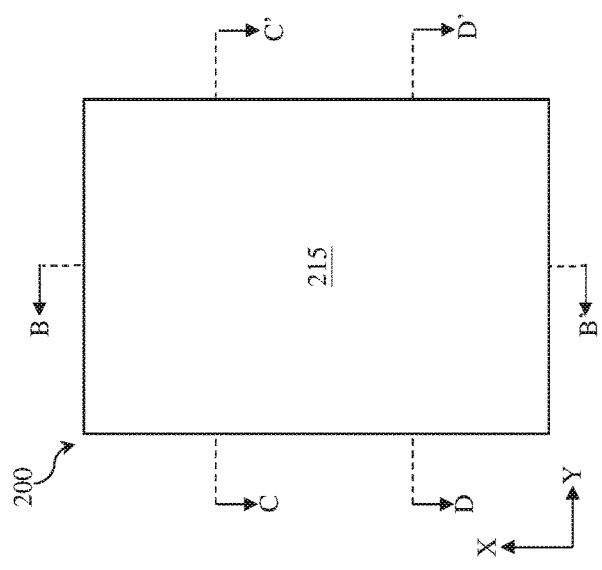
Figure 2C:
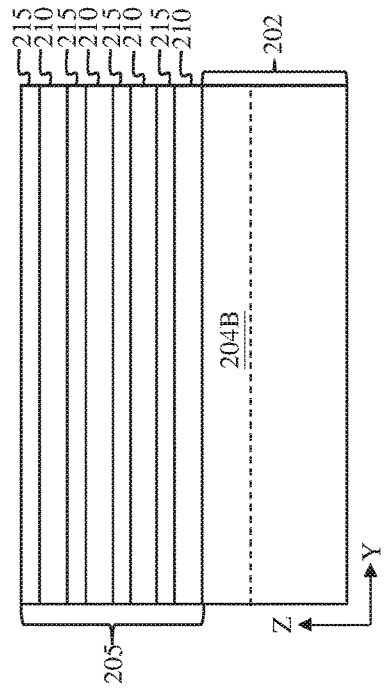
Figure 2D:
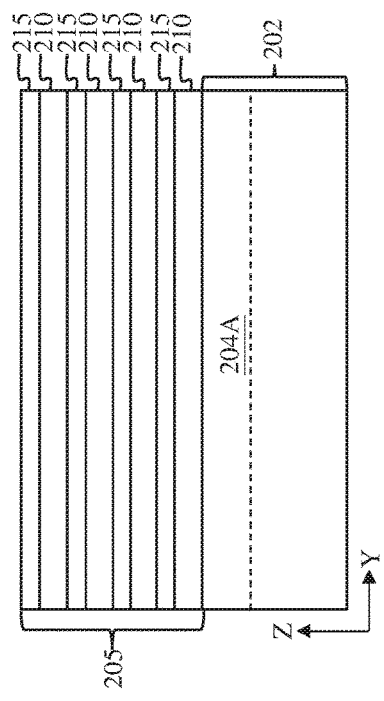
Figure 3A:
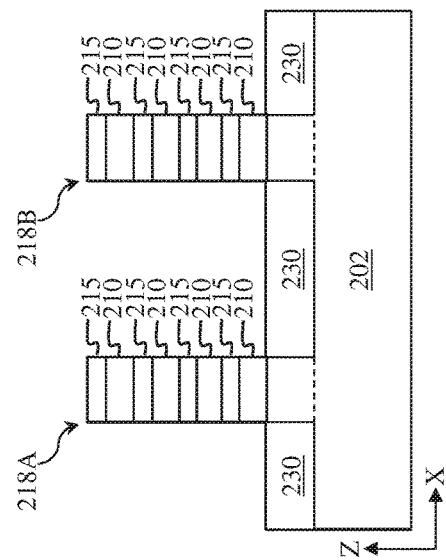
Figure 3B:
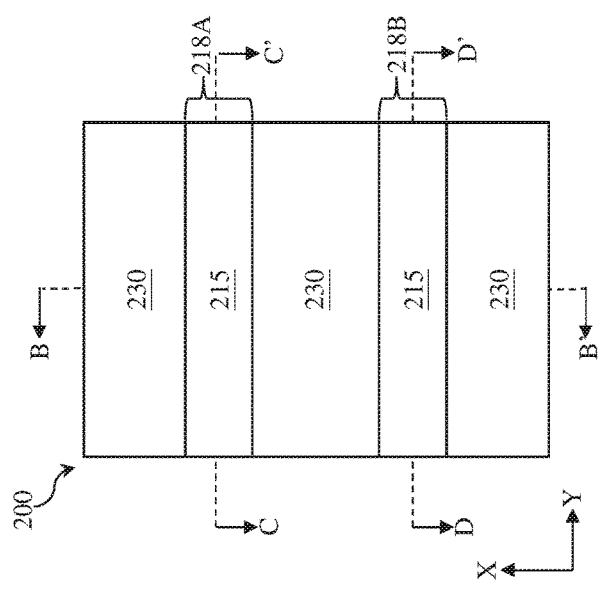
Figure 3C:
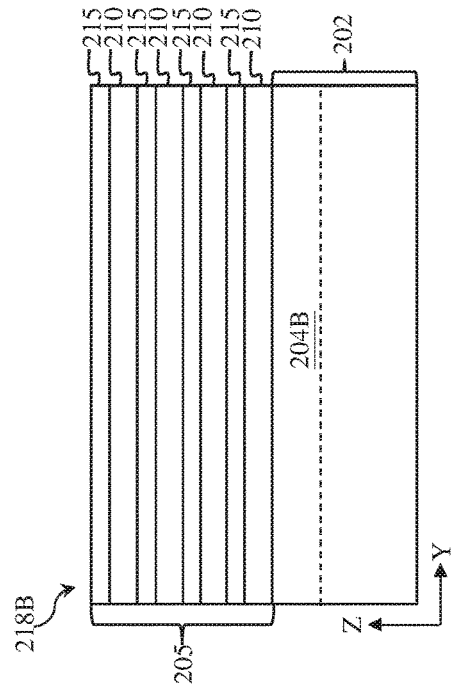
Figure 3D:
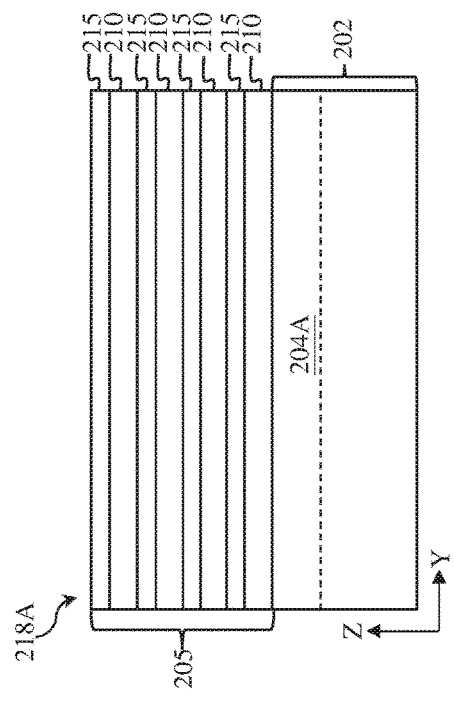
Figure 4A:
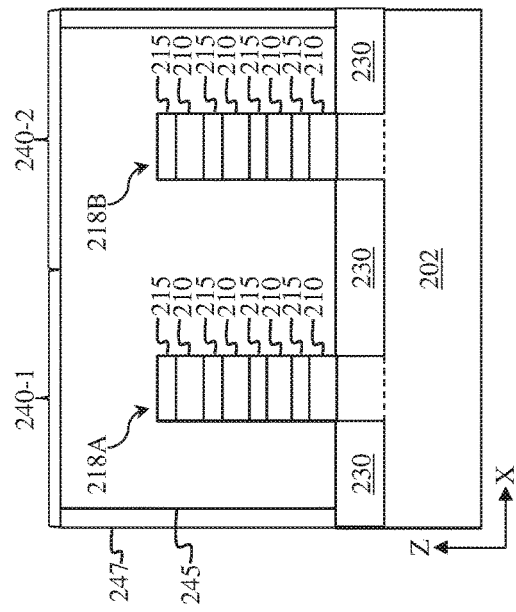
Figure 4B:
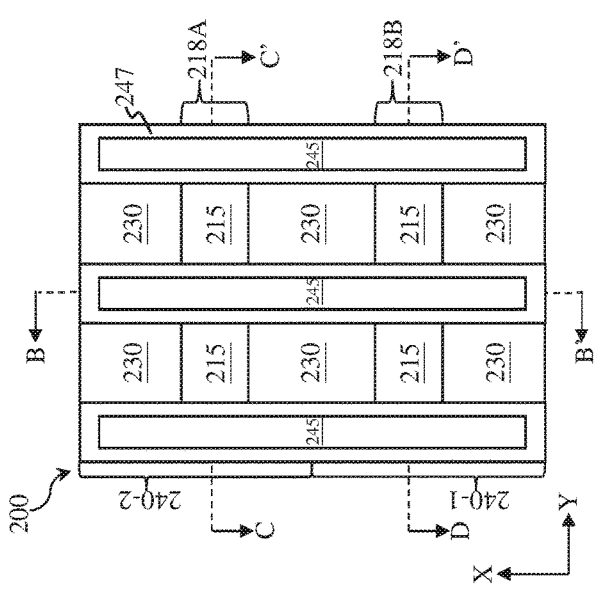
Figure 4C:
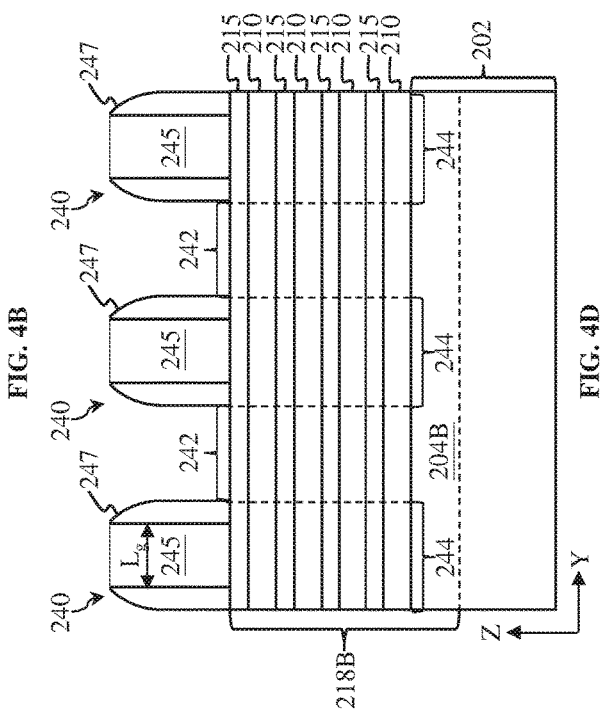
Figure 4D:
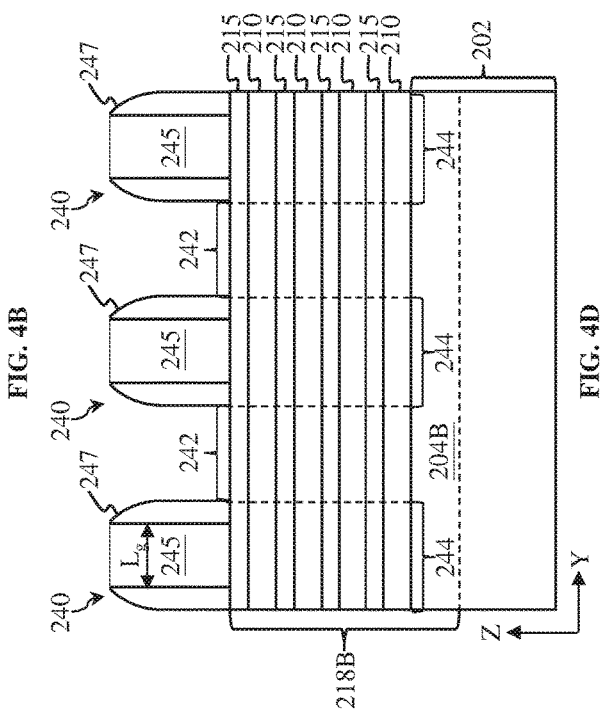
Figure 5A:
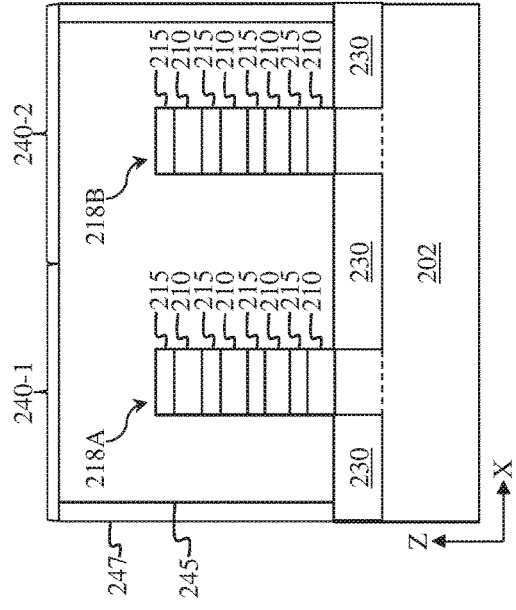
Figure 5B:
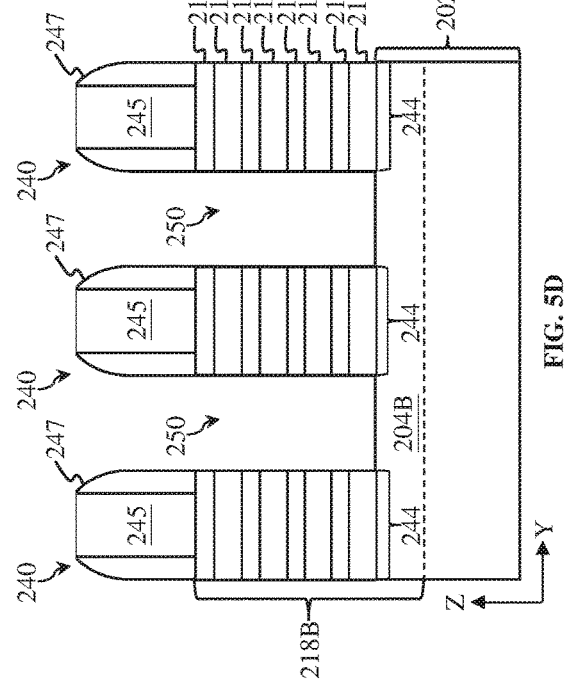
Figure 5C:
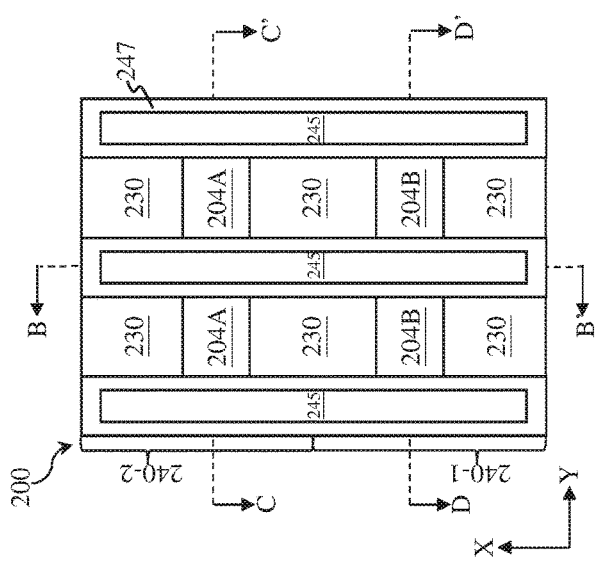
Figure 5D:
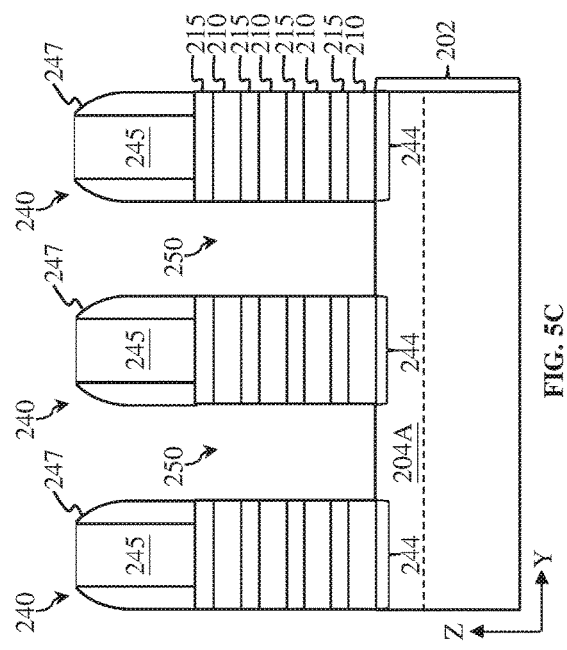
Figure 6A:
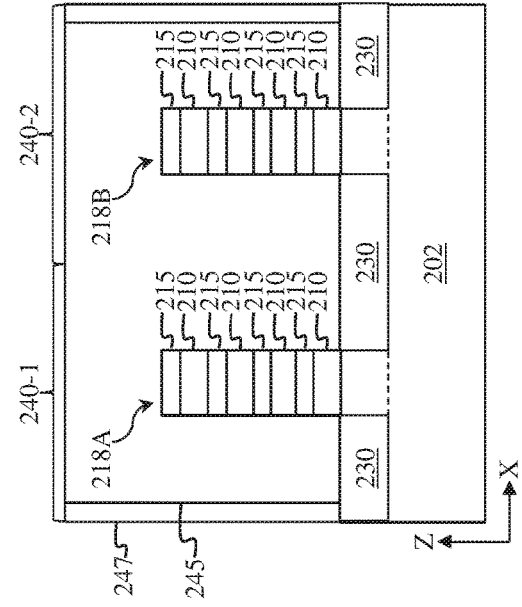
Figure 6B:
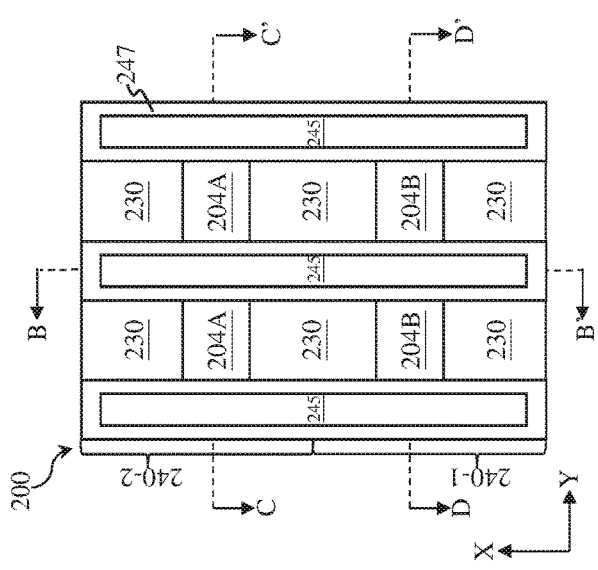
Figure 6C:
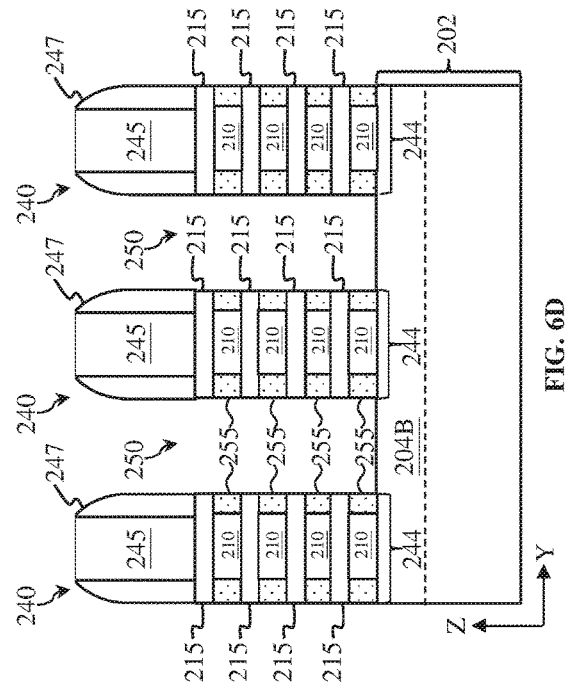
Figure 6D:
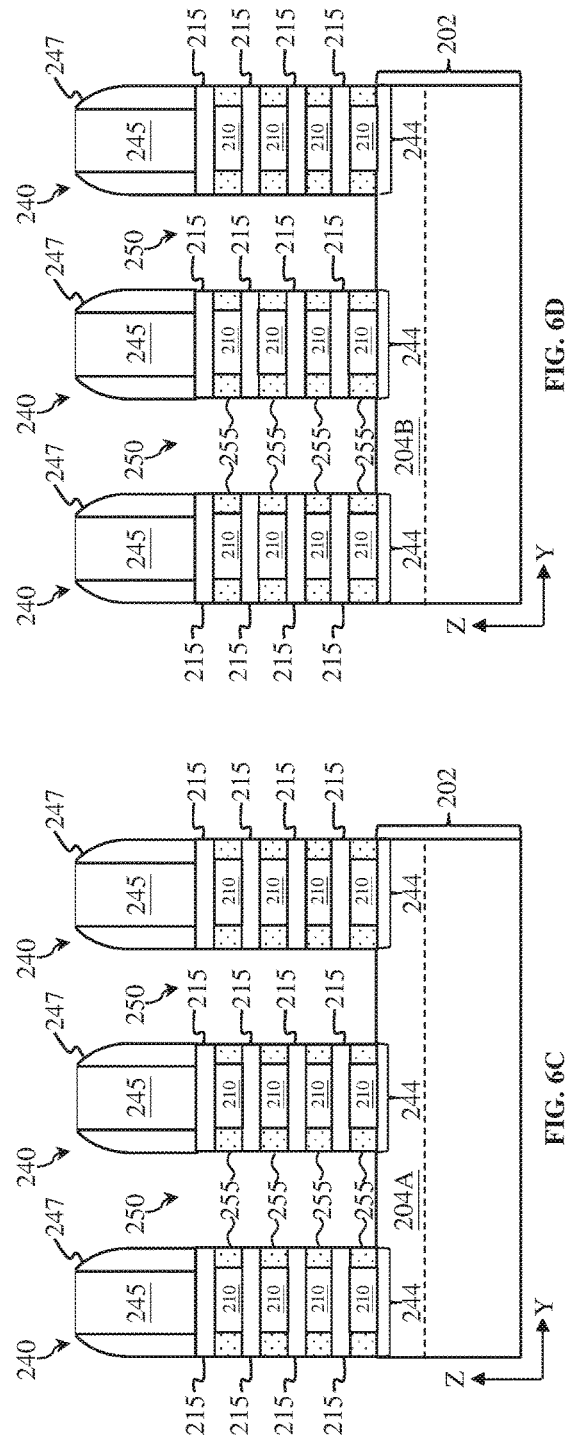
Figure 7B:
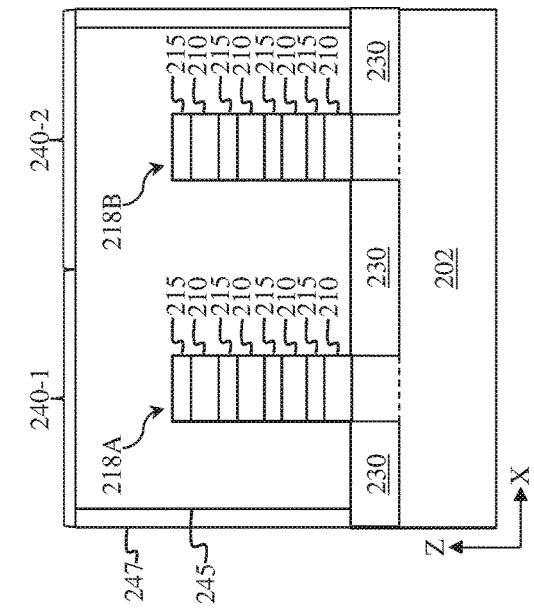
Figure 7D:
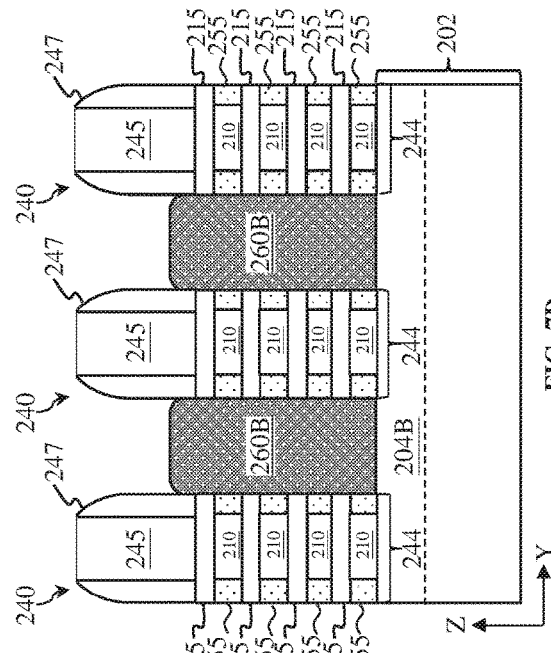
Figure 7A:
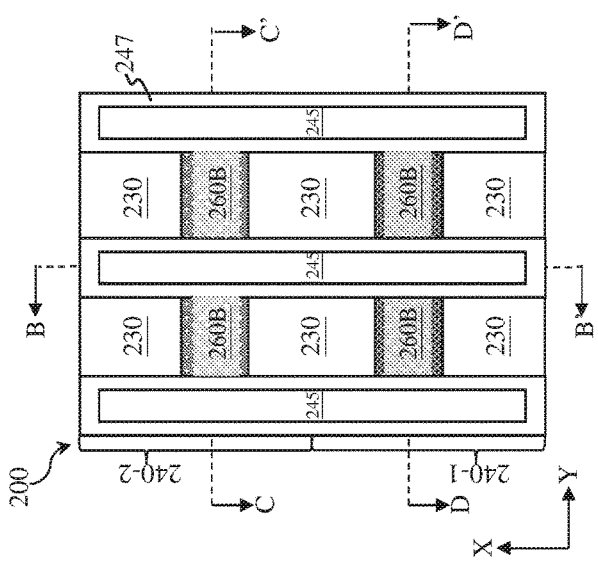
Figure 7C:
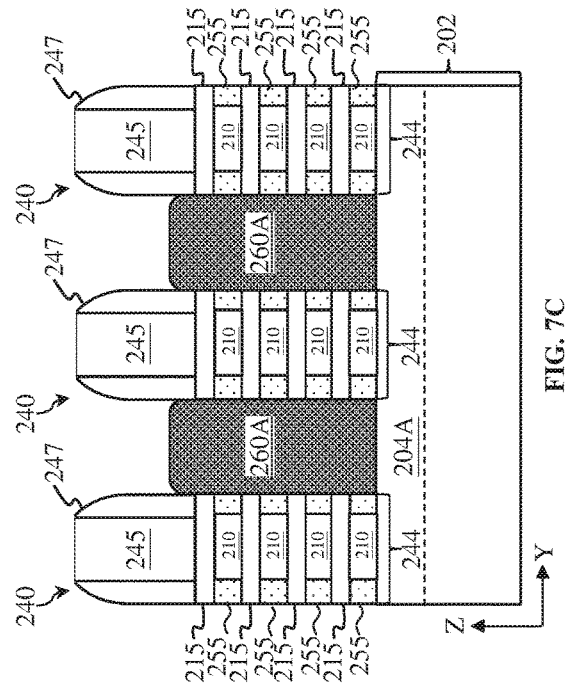
Figure 10A:
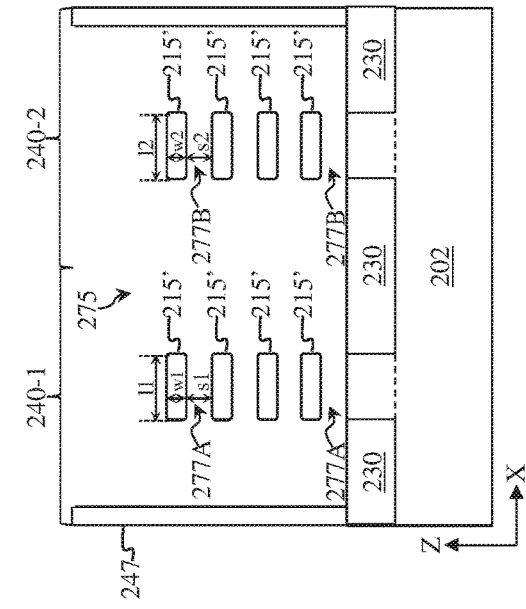
Figure 10B:
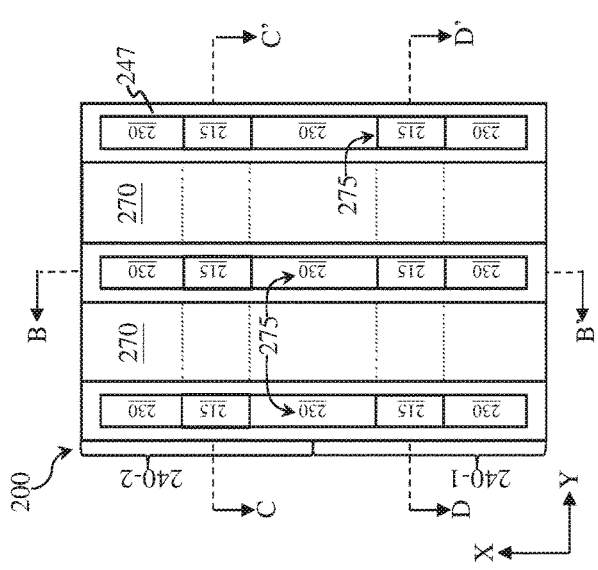
Figure 10C:
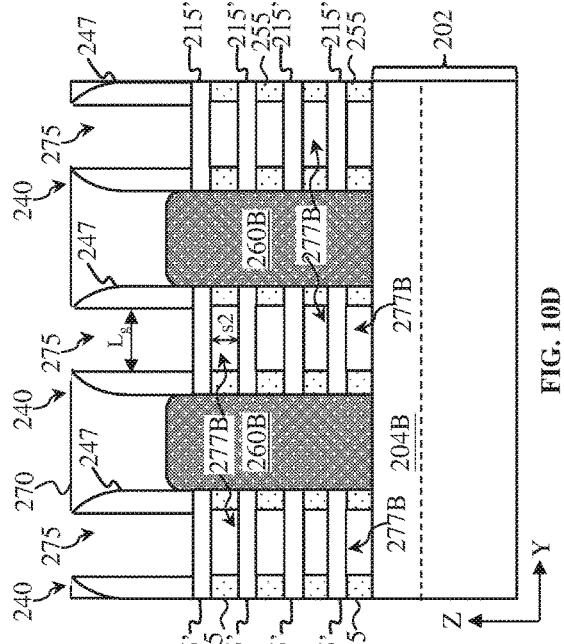
Figure 10D:
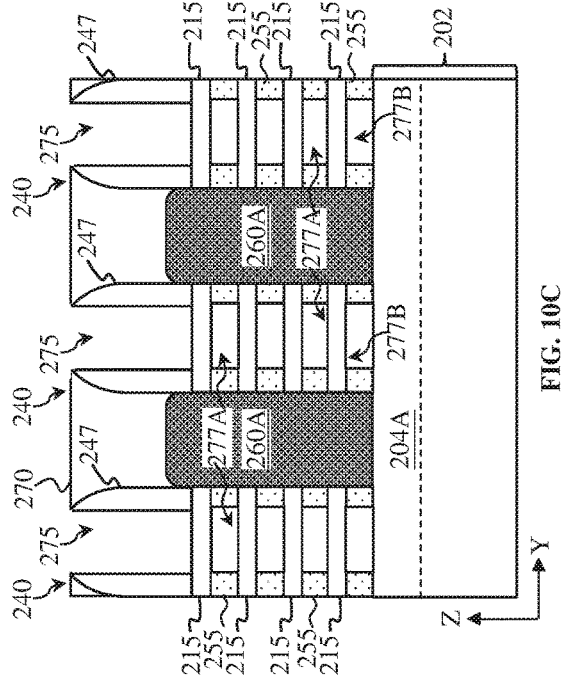
Figure 11A:
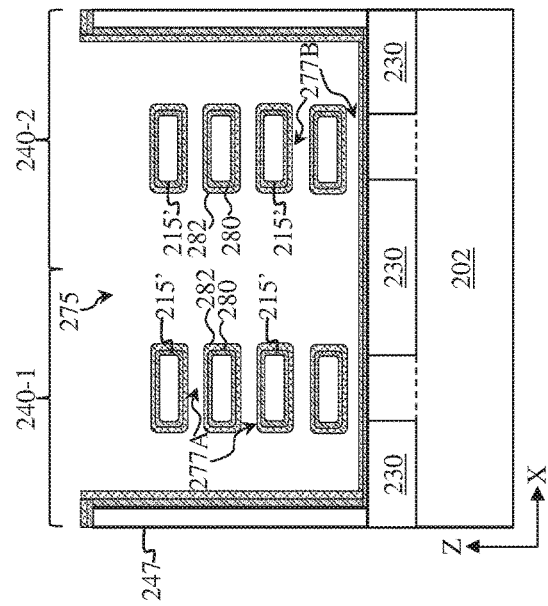
Figure 11B:
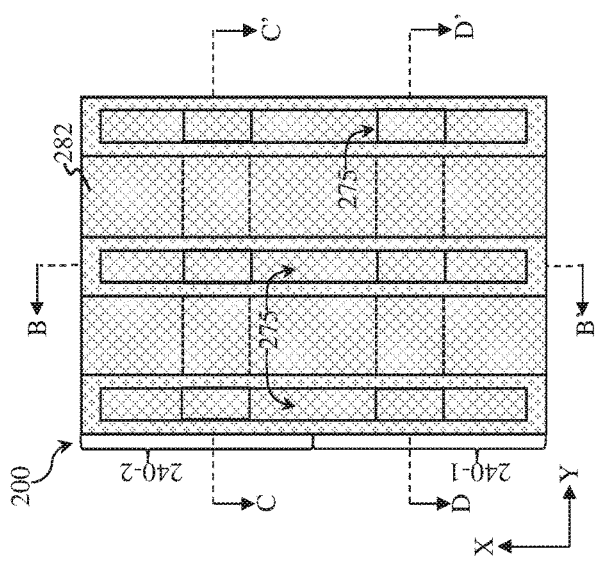
Figure 11C:
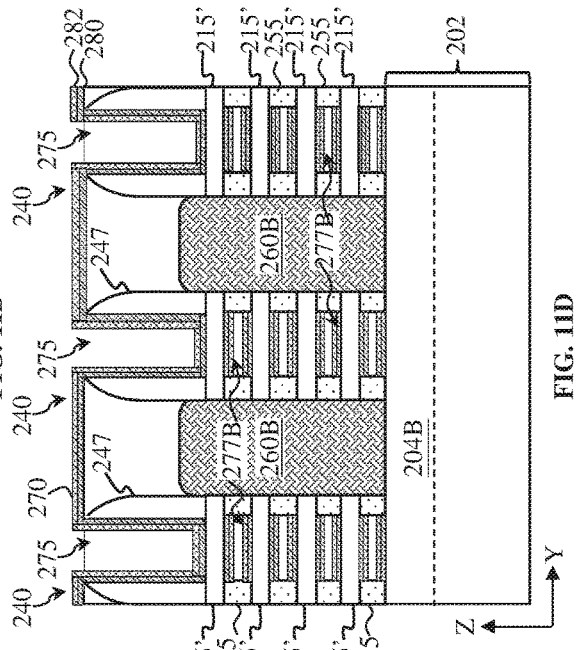
Figure 11D:
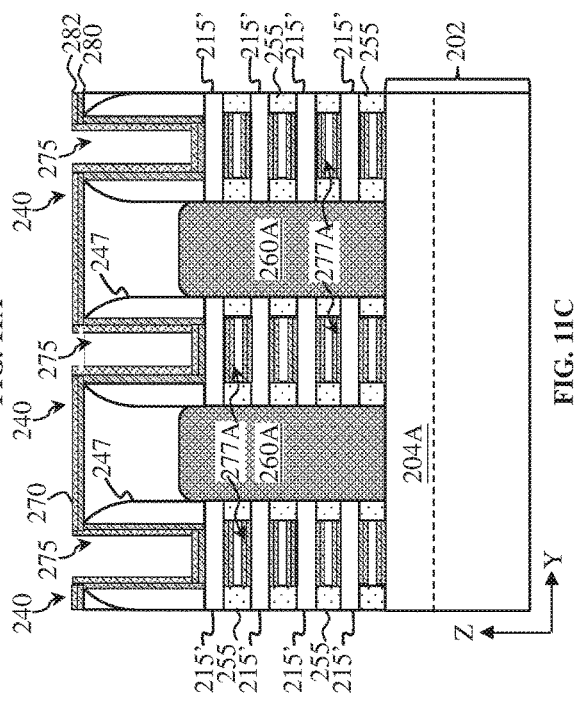
Figure 12A:
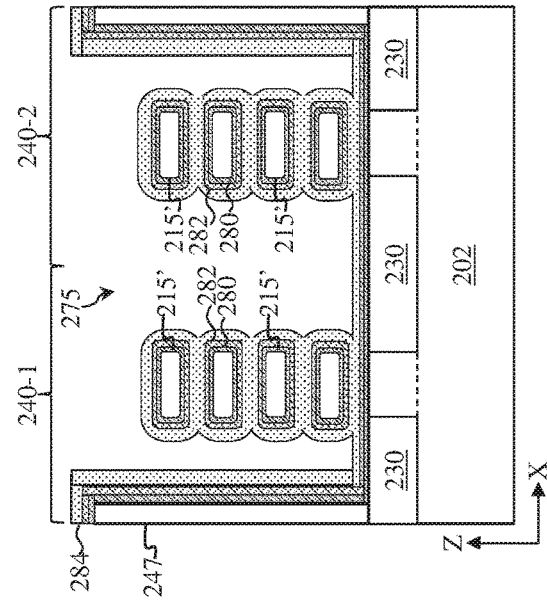
Figure 12B:
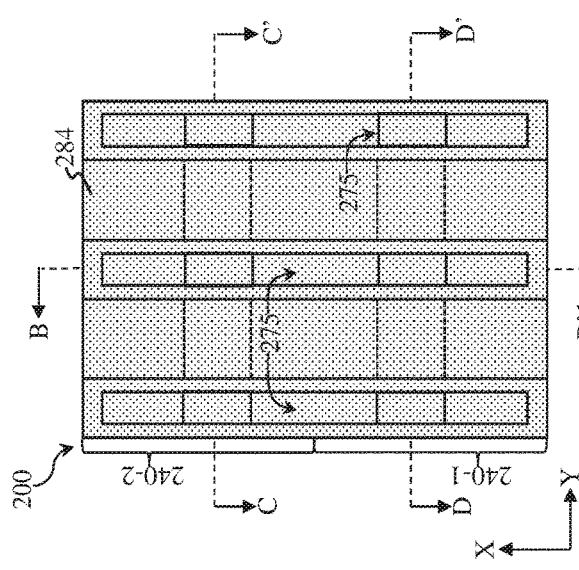
Figure 12C:
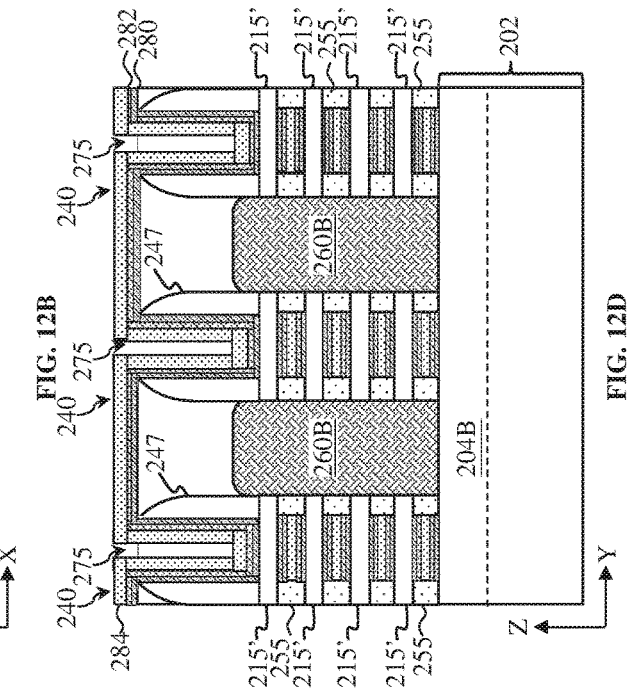
Figure 12D:
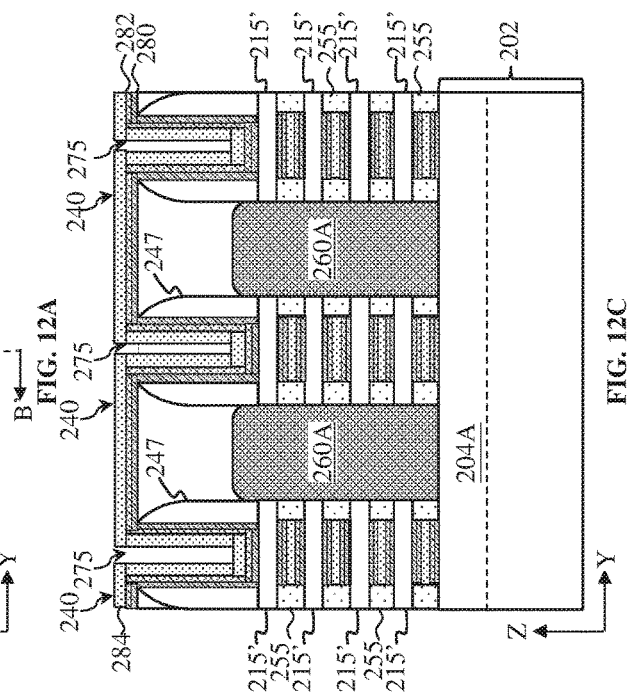
Figure 16B:
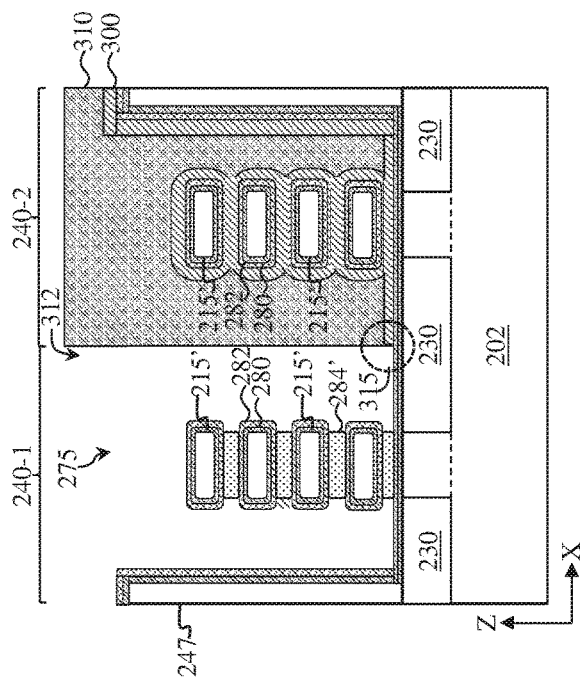
Figure 16D:
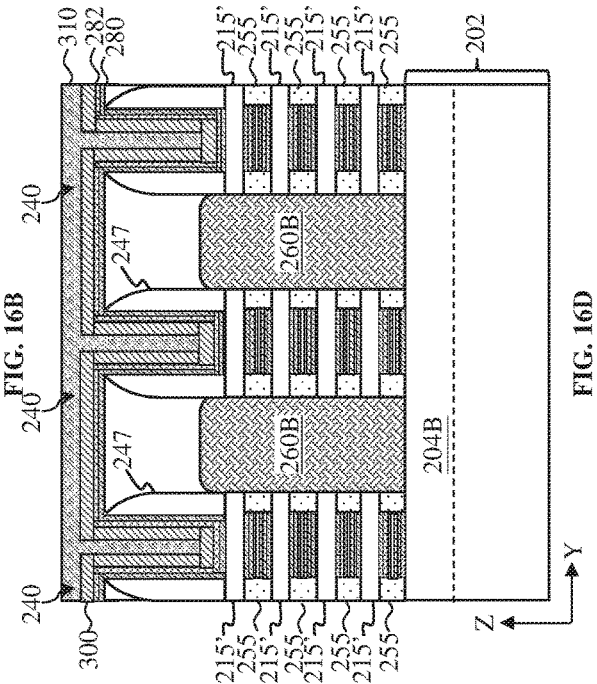
Figure 16A:
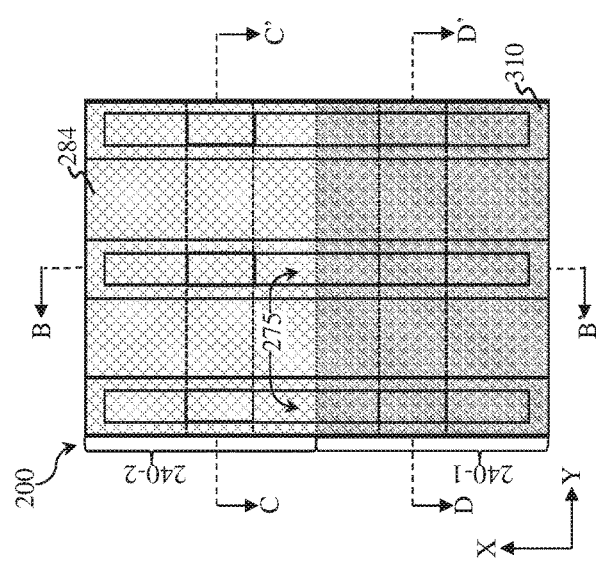
Figure 16C:
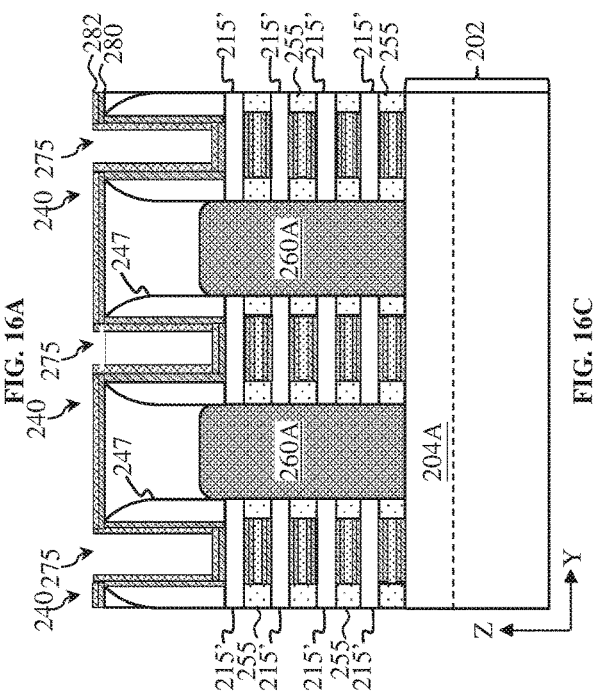
Figures 19A, 19B, 19C, 19D:
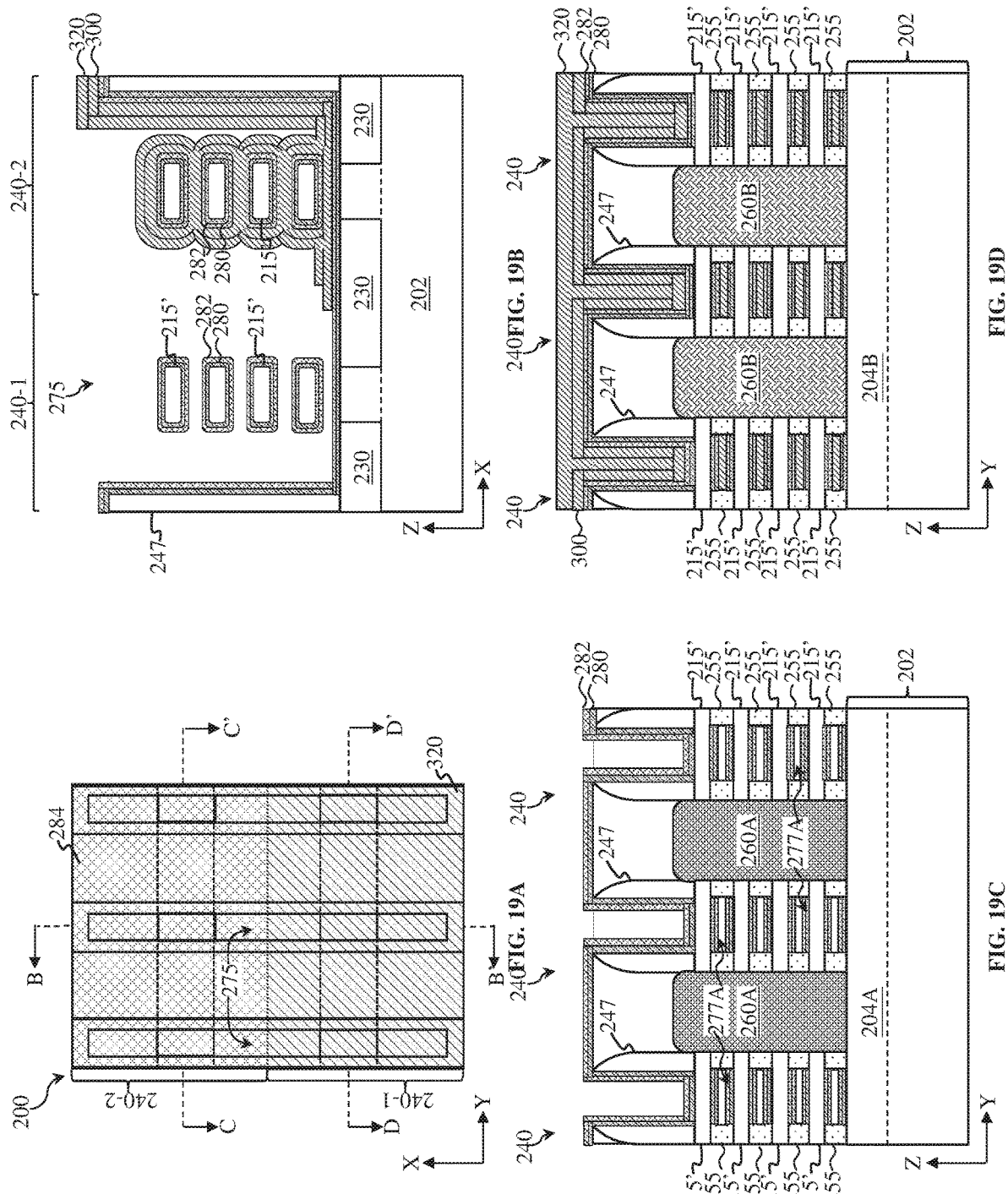
Figures 21A, 21B, 21C, 21D:
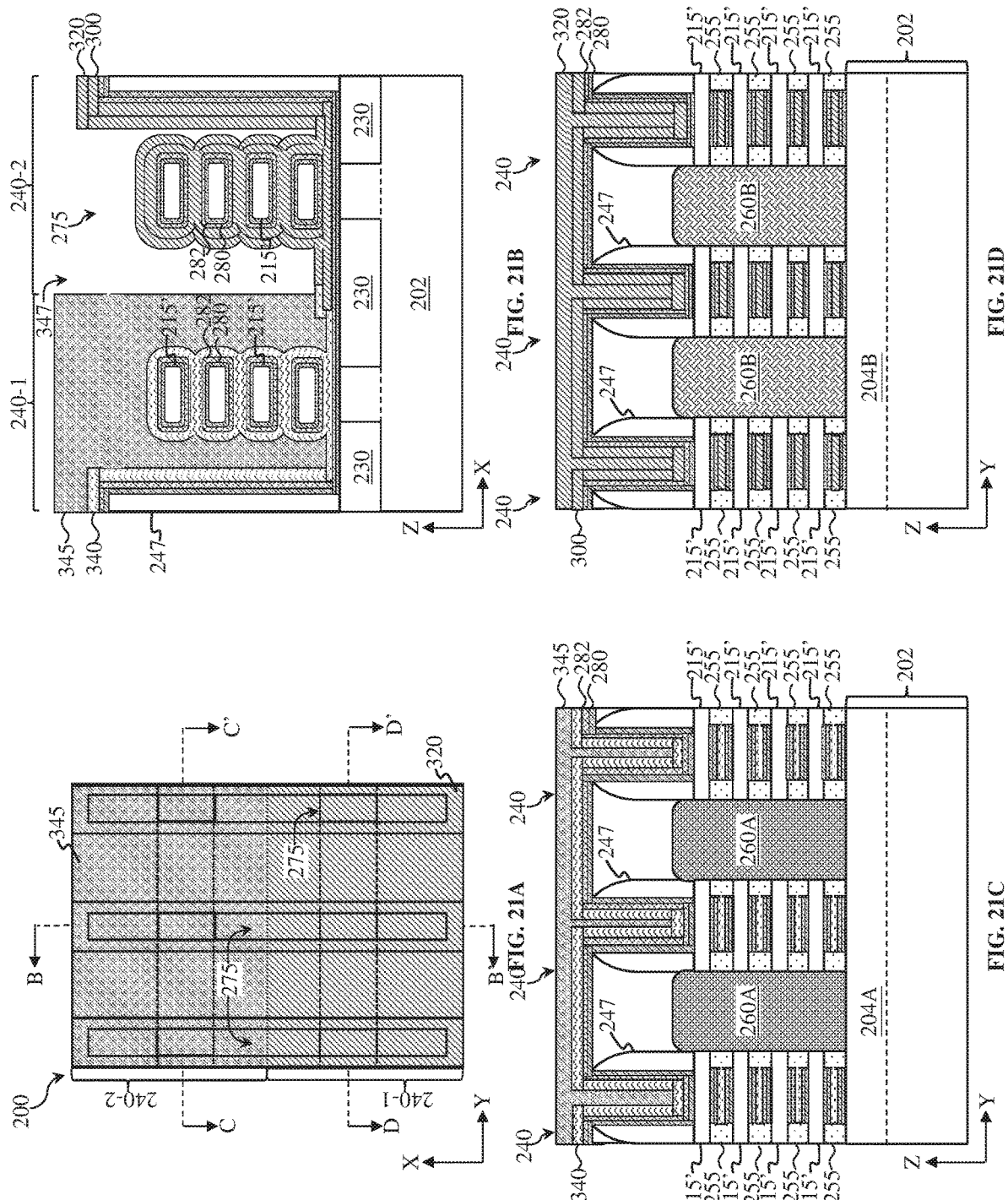

FIG. 1A and FIG. 1B are a flow chart of a method 100 for fabricating a multigate device according to various aspects of the present disclosure. In some embodiments, method 100 fabricates a multi-gate device that includes p-type GAA transistors and n-type GAA transistors. At block 102, a first semiconductor layer stack and a second semiconductor layer stack are formed over a substrate. The first semiconductor layer stack and the second semiconductor layer stack include first semiconductor layers and second semiconductor layers stacked vertically in an alternating configuration. At block 104, a gate structure is formed over a first region of the first semiconductor layer stack and a first region of the second semiconductor layer stack. The gate structure includes a dummy gate stack and gate spacers. At block 106, portions of the first semiconductor layer stack in second regions and portions of the second semiconductor layer stack in second regions are removed to form source/drain recesses. At block 108, inner spacers are formed along sidewalls of the first semiconductor layers in the first semiconductor layer stack and the second semiconductor layer stack. At block 110, epitaxial source/drain features are formed in the source/drain recesses. At block 112, an interlayer dielectric (ILD) layer is formed over the epitaxial source/drain features. At block 114, the dummy gate stack is removed, thereby forming a gate trench that exposes the first semiconductor layer stack in a p-type gate region and the second semiconductor layer stack in n-type gate region. At block 116, the first semiconductor layers are removed from the first semiconductor layer stack and the second semiconductor layer stack exposed by the gate trench, thereby forming gaps between the second semiconductor layers. At block 118, a gate dielectric layer is formed in the gate trench around the second semiconductor layers in the p-type gate region and the n-type gate region. The gate dielectric layer partially fills the gaps between the second semiconductor layers.

At block 120, a sacrificial layer is formed over the gate dielectric layer in the gate trench in the p-type gate region and the n-type gate region. The sacrificial layer fills any remaining portion of the gaps between the second semiconductor layers. At block 122, the sacrificial layer is patterned to form sacrificial features between the second semiconductor layers in the p-type gate region and the n-type gate region. At block 124, the sacrificial features from are removed from between the second semiconductor layers in the p-type gate region. At block 126, a p-type work function layer is formed in the gate trench over the gate dielectric in the p-type gate region and the n-type gate region. At block 128, the p-type work function layer is removed from the gate trench in the n-type gate region. At block 130, a determination is made whether the gate dielectric layer and the p-type work function layer fill the gate trench in the p-type gate region along a gate length direction. If no, block 128 and block 130 are repeated. If yes, method 100 proceeds to block 132, where the sacrificial features are removed from between the second semiconductor layers in the n-type gate region. At block 134, an n-type work function layer is formed in the gate trench over the gate dielectric layer in the n-type gate region and over the p-type work function layer in the p-type gate region. At block 136, the n-type work function layer is removed from the gate trench in the p-type gate region. At block 138, a metal bulk layer is formed in the gate trench over the n-type work function layer in the n-type gate region and over the p-type work function layer in the p-type gate region. At block 140, a planarization process is performed on the metal bulk layer, the n-type work function layer, the p-type work function layer, and the gate dielectric layer, thereby forming a p-metal gate in the p-type gate region and an n-metal gate in the n-type gate region. Method 100 then proceeds to block 142 where contacts are formed. Additional processing is contemplated by the present disclosure. Additional steps can be provided before, during, and after method 100, and some of the steps described can be moved, replaced, or eliminated for additional embodiments of method 100. The discussion that follows illustrates various embodiments of nanowire-based integrated circuit devices that can be fabricated according to method 100.

FIGS. 2A-23A, FIGS. 2B-23B, FIGS. 2C-23C, and FIGS. 2D-23D are fragmentary diagrammatic views of a multigate device 200, in portion or entirety, at various fabrication stages (such as those associated with method 100 in FIG. 1A and FIG. 1B) according to various aspects of the present disclosure. In particular, FIGS. 2A-23A are top views of multigate device 200 in an X-Y plane; FIGS. 2B-23B are diagrammatic cross-sectional views of multigate device 200 in an X-Z plane along lines B-B' respectively of FIGS. 2A-23A, FIGS. 2C-23C are diagrammatic cross-sectional views of multigate device 200 in a Y-Z plane along lines C-C' respectively of FIGS. 2A-23A; and FIGS. 2D-23D are diagrammatic cross-sectional views of multigate device 200 in the Y-Z plane along lines D-D' respectively of FIGS. 2A-23A. Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-23A, FIGS. 2B-23B, FIGS. 2C-23C, and FIGS. 2D-23D have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2D, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, substrate 202 includes a p-type doped region 204A (referred to hereinafter as a p-well), which can be configured for n-type GAA transistors, and an n-type doped region 204B (referred to hereinafter as an n-well), which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 215, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of multigate device 200. In the depicted embodiment, semiconductor layer stack 205 includes four semiconductor layers 210 and four semiconductor layers 215 configured to form four semiconductor layer pairs disposed over substrate 202, each semiconductor layer pair having a respective first semiconductor layer 210 and a respective second semiconductor layer 215. After undergoing subsequent processing, such configuration will result in multigate device 200 having four channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 and thickness t2 are about 1 nm to about 10 nm.

Turning to FIGS. 3A-3D, semiconductor layer stack 205 is patterned to form a fin 218A and a fin 218B (also referred to as fin structures, fin elements, etc.). Fins 218, 218B include a substrate portion (i.e., a portion of substrate 202) and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 is formed over and/or in substrate 202 to isolate various regions, such as various device regions, of multigate device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B (e.g., doped regions 204A, 204B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. For example, isolation features 230 can include STI features that define and electrically isolate fins 218A, 218B from other active device regions (such as fins) and/or passive device regions. STI features can be formed by etching a trench in substrate 202 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming fins 218A, 218B (in some implementations, such that the insulator material layer fills gaps (trenches) between fins 218A, 218B) and etching back the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Turning to FIGS. 4A-4D, gate structures 240 are formed over portions of fins 218A, 218B and over isolation features 230. Gate structures 240 extend lengthwise in a direction that is different than (e.g., orthogonal to) the lengthwise direction of fins 218A, 218B. For example, gate structures 240 extend substantially parallel to one another along the x-direction, having a length defined in the y-direction, a width defined in the x-direction, and a height defined in the z-direction. Gate structures 240 are disposed on portions of fins 218A, 218B and define source/drain regions 242 and channel regions 244 of fins 218A, 218B. In the X-Z plane, gate structures 240 wrap top surfaces and sidewall surfaces of fins 218A, 218B. In the Y-Z plane, gate structures 240 are disposed over top surfaces of respective channel regions 244 of fins 218A, 218B, such that gate structures 240 interpose respective source/drain regions 242. Each gate structure 240 includes a gate region 240-1 that corresponds with a portion of the respective gate structure 240 that will be configured for an n-type GAA transistor (and thus corresponds with a portion spanning an n-type GAA transistor region) and a gate region 240-2 that corresponds with a portion of the respective gate structure 240 that will be configured for a p-type GAA transistor (and thus corresponds with a portion spanning a p-type GAA transistor region). Gate structures 240 are configured differently in gate region 240-1 and gate region 240-2. For example, as described further below, each metal gate stack of gate structures 240 spans gate region 240-1 and gate region 240-2 and is configured differently in gate region 240-1 and gate region 240-2 to optimize performance of the n-type GAA transistors (having n-gate electrodes in gate regions 240-1) and the p-type GAA transistors (having p-gate electrodes in gate regions 240-2). Accordingly, gate regions 240-1 will be referred to as n-type gate regions 240-1 and gate regions 240-2 will be referred to as p-type gate regions 240-2 hereinafter.

In FIGS. 4A-4D, each gate structure 240 includes a dummy gate stack 245. In the depicted embodiment, a width of dummy gate stacks 245 defines a gate length ($L_g$) of gate structures 240 (here, in the y-direction), where the gate length defines a distance (or length) that current (e.g., carriers, such as electrons or holes) travels between source/drain regions 242 when the n-type GAA transistor and/or the p-type GAA transistor are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 240 is configured to provide GAA transistors having short-length (SC) channels. For example, the gate length of SC GAA transistors is about 5 nm to about 20 nm. In some embodiments, multigate device 200 can include GAA transistors having different gate lengths. For example, a gate length of one or more of gate structures 240 can be configured to provide GAA transistors having mid-length or long-length channels (M/LC). In some embodiments, the gate length of M/LC GAA transistors is about 20 nm to about 250 nm.

Dummy gate stacks 245 include a dummy gate electrode, and in some embodiments, a dummy gate dielectric. The dummy gate electrode includes a suitable dummy gate material, such as polysilicon layer. In embodiments where dummy gate stacks 245 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 245 can include numerous other layers, for example, capping layers, interface layers, diffusion layers, barrier layers, hard mask layers, or combinations thereof. For example, dummy gate stacks 245 can further include a hard mask layer disposed over the dummy gate electrode.

Dummy gate stacks 245 are formed by deposition processes, lithography processes, etching processes, other suitable processes, or combinations thereof. For example, a deposition process is performed to form a dummy gate electrode layer over fins 218A, 218B and isolation features 230. In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 245, such that dummy gate stacks 245 (including the dummy gate electrode layer, the dummy gate dielectric layer, the hard mask layer, and/or other suitable layers) is configured as depicted in FIGS. 4A-4D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Each gate structure 240 further includes gate spacers 247 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 245 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 245. In such implementations, the various sets of spacers can include materials having different etch rates. For example, a first dielectric layer including silicon and oxygen (e.g., silicon oxide) can be deposited and etched to form a first spacer set adjacent to dummy gate stacks 245, and a second dielectric layer including silicon and nitrogen (e.g., silicon nitride) can be deposited and etched to form a second spacer set adjacent to the first spacer set.

Turning to FIGS. 5A-5D, exposed portions of fins 218A, 218B (i.e., source/drain regions 242 of fins 218A, 218B that are not covered by gate structures 240) are at least partially removed to form source/drain trenches (recesses) 250. In the depicted embodiment, an etching process completely removes semiconductor layer stack 205 in source/drain regions 242 of fins 218A, 218B, thereby exposing the substrate portion of fins 218A, 218B in source/drain regions 242 (e.g., p-well 204A and n-well 204B). Source/drain trenches 250 thus have sidewalls defined by remaining portions of semiconductor layer stack 205, which are disposed in channel regions 244 under gate structures 240, and bottoms defined by substrate 202, such as top surfaces of p-well 204A and n-well 204B in source/drain regions 242. In some embodiments, the etching process removes some, but not all, of semiconductor layer stack 205, such that source/drain trenches 250 have bottoms defined by semiconductor layer 210 or semiconductor layer 215 in source/drain regions 242. In some embodiments, the etching process further removes some, but not all, of the substrate portion of fins 218A, 218B, such that source/drain recesses 250 extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate structures 240 (i.e., dummy gate stacks 245 and gate spacers 247) and/or isolation features 230. In some embodiments, a lithography process, such as those described herein, is performed to form a patterned mask layer that covers gate structures 240 and/or isolation features 230, and the etching process uses the patterned mask layer as an etch mask.

Turning to FIGS. 6A-6D, inner spacers 255 are formed in channel regions 244 along sidewalls of semiconductor layers 210 by any suitable process. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and substrate 202 under gate spacers 247. Portions (edges) of semiconductor layers 215 are thus suspended in the channel regions 244 under gate spacers 247. In some embodiments, the gaps extend partially under dummy gate stacks 245. The first etching process is configured to laterally etch (e.g., along the y-direction) semiconductor layers 210, thereby reducing a length of semiconductor layers 210 along the y-direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and substrate 202), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 202 under gate spacers 247. A second etching process is then performed that selectively etches the spacer layer to form inner spacers 255 as depicted in FIGS. 6A-6D with minimal (to no) etching of semiconductor layers 215, dummy gate stacks 245, and gate spacers 247. In some embodiments, the spacer layer is removed from sidewalls of gate spacers 247, sidewalls of semiconductor layers 215, dummy gate stacks 245, and substrate 202. The spacer layer (and thus inner spacers 255) includes a material that is different than a material of semiconductor layers 215 and a material of gate spacers 247 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that spacer layer includes a doped dielectric material.

Turning to FIGS. 7A-7D, epitaxial source/drain features are formed in source/drain recesses 250. For example, a semiconductor material is epitaxially grown from portions of substrate 202 and semiconductor layers 215 exposed by source/drain recesses 250, forming epitaxial source/drain features 260A in source/drain regions 242 that correspond with n-type GAA transistor regions and epitaxial source/drain features 260B in source/drain regions 242 that correspond with p-type GAA transistor regions. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 215). Epitaxial source/drain features 260A, 260B are doped with n-type dopants and/or p-type dopants. In some embodiments, for the n-type GAA transistors, epitaxial source/drain features 260A include silicon. Epitaxial source/drain features 260A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 260B include silicon germanium or germanium. Epitaxial source/drain features 260B can be doped with boron, other p-type dopant, or combinations thereof (for example, forming Si:Ge:B epitaxial source/drain features). In some embodiments, epitaxial source/drain features 260A and/or epitaxial source/drain features 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions 244. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type GAA transistor regions when forming epitaxial source/drain features 260A in n-type GAA transistor regions and masking n-type GAA transistor regions when forming epitaxial source/drain features 260B in p-type GAA transistor regions.

Turning to FIGS. 8A-8D, an inter-level dielectric (ILD) layer 270 is formed over isolation features 230, epitaxial source/drain features 260A, 260B, and gate spacers 247, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 270 is disposed between adjacent gate structures 240. In some embodiments, ILD layer 270 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In the depicted embodiment, ILD layer 270 is a dielectric layer that includes a low-k dielectric material (generally referred to as a low-k dielectric layer). ILD layer 270 can include a multilayer structure having multiple dielectric materials. In some embodiments, a contact etch stop layer (CESL) is disposed between ILD layer 270 and isolation features 230, epitaxial source/drain features 260A, 260B, and gate spacers 247. The CESL includes a material different than ILD layer 270, such as a dielectric material that is different than the dielectric material of ILD layer 270. For example, where ILD layer 270 includes a low-k dielectric material, the CESL includes silicon and nitrogen, such as silicon nitride or silicon oxynitride. Subsequent to the deposition of ILD layer 270 and/or the CESL, a CMP process and/or other planarization process can be performed until reaching (exposing) a top portion (or top surface) of dummy gate stacks 245. In some embodiments, the planarization process removes hard mask layers of dummy gate stacks 245 to expose underlying dummy gate electrodes of dummy gate stacks 245, such as polysilicon gate electrode layers.

ILD layer 170 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/ or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 9A-9D, dummy gate stacks 245 are removed from gate structures 240, thereby exposing semiconductor layer stacks 205 of fins 218A, 218B in n-type gate regions 240-1 and p-type gate regions 240-2. In the depicted embodiment, an etching process completely removes dummy gate stacks 245 to expose semiconductor layers 215 and semiconductor layers 210 in channel regions 244. The etching process is a dry etching process, a wet etching process, other suitable etching process, or combinations thereof. In some embodiments, the etching process is a multi-step etch process. For example, the etching process may alternate etchants to separately remove various layers of dummy gate stacks 245, such as the dummy gate electrode layers, the dummy gate dielectric layers, and/or the hard mask layers. In some embodiments, the etching process is configured to selectively etch dummy gate stacks 245 with minimal (to no) etching of other features of multigate device 200, such as ILD layer 270, gate spacers 247, isolation features 230, semiconductor layers 215, and semiconductor layers 210. In some embodiments, a lithography process, such as those described herein, is performed to form a patterned mask layer that covers ILD layer 270 and/or gate spacers 247, and the etching process uses the patterned mask layer as an etch mask.

Turning to FIGS. 10A-10D, semiconductor layers 210 of semiconductor layer stack 205 (exposed by gate trenches 275) are selectively removed from channel regions 244, thereby forming suspended semiconductor layers 215' in channel regions 244. In the depicted embodiment, an etching process selectively etches semiconductor layers 210 with minimal (to no) etching of semiconductor layers 215 and, in some embodiments, minimal (to no) etching of gate spacers 247 and/or inner spacers 255. Various etching parameters can be tuned to achieve selective etching of semiconductor layers 210, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 210 (in the depicted embodiment, silicon germanium) at a higher rate than the material of semiconductor layers 215 (in the depicted embodiment, silicon) (i.e., the etchant has a high etch selectivity with respect to the material of semiconductor layers 210). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 210. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 210. In some embodiments, a chemical vapor phase etching process using hydrochloric acid (HCl) selectively etches semiconductor layers 210.

At least one suspended semiconductor layer 215' is thus exposed in n-type gate regions 240-1 and p-type gate regions 240-2 by gate trenches 275. In the depicted embodiment, each n-type gate region 240-1 and each p-type gate region 240-2 includes four suspended semiconductor layers 215' vertically stacked that will provide four channels through which current will flow between respective epitaxial source/drain features (epitaxial source/drain features 260A or epitaxial source/drain features 260B) during operation of the GAA transistors. Suspended semiconductor layers 215' are thus referred to as channel layers 215' hereinafter. Channel layers 215' in n-type gate regions 240-1 are separated by gaps 277A, and channel layers 215' in p-type gate regions 240-2 are separated by gaps 277B. Channel layers 215' in n-type gate regions 240-1 are also separated from substrate 202 by gaps 277A, and channel layers 215' in p-type gate regions 240-2 are also separated by gaps 277B. A spacing s1 is defined between channel layers 215' along the z-direction in n-type gate regions 240-1, and a spacing s2 is defined between channel layers 215' along the z-direction in p-type gate regions 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 210. Further, channel layers 215' in n-type gate regions 240-1 have a length l1 along the x-direction and a width w1 along the y-direction, and channel layers 215' in p-type gate regions 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 10A-10D can be referred to as a channel nanowire release process. In some embodiments, after removing semiconductor layers 210, an etching process is performed to modify a profile of channel layers 215' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 215' (nanowires) have sub-nanometer dimensions depending on design requirements of multigate device 200.

Turning to FIGS. 11A-11D, a gate dielectric layer is formed over multigate device 200, where the gate dielectric layer partially fills gate trenches 275 and wraps (surrounds) channel layers 215' in n-type gate regions 240-1 and p-type gate regions 240-2 of gate structures 240. In the depicted embodiment, the gate dielectric layer includes an interfacial layer 280 and a high-k dielectric layer 282, where interfacial layer 280 is disposed between the high-k dielectric layer 282 and channel layers 215'. In furtherance of the depicted embodiment, interfacial layer 280 and high-k dielectric layer 282 partially fill gaps 277A between channel layers 215' and between channel layers 215' and substrate 202 in n-type gate regions 240-1 and partially fill gaps 277B between channel layers 215' and between channel layers 215' and substrate 202 in p-type gate regions 240-2. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-comprising dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, $Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm.

Turning to FIGS. 12A-12D, a sacrificial (dummy) layer 284 is deposited over multigate device 200, where sacrificial layer 284 partially fills gate trenches 275 and wraps (surrounds) channel layers 215' in n-type gate regions 240-1 and p-type gate regions 240-2. For example, sacrificial layer 284 is deposited on the gate dielectric layer by any of the processes described herein, such as ALD, CVD, PVD, other suitable process, or combinations thereof. In the depicted embodiment, sacrificial layer 284 is disposed on high-k dielectric layer 282 and surrounds high-k dielectric layer 282, interfacial layer 280, and channel layers 215'. For example, sacrificial layer 284 is disposed along sidewalls, tops, and bottoms of channel layers 215'. A thickness of sacrificial layer 284 is configured to fill any remaining portion of gaps 277A between channel layers 215' in n-type gate regions 240-1 and any remaining portion of gaps 277B between channel layers 215' in p-type gate regions 240-2 without filling gate trenches 275 (i.e., any portions of gaps 277A, 277B not filled by the gate dielectric layer). In some embodiments, the thickness of sacrificial layer 284 is about 0.5 nm to about 5 nm. Sacrificial layer 284 includes a material that is different than a high-k dielectric material to achieve etching selectivity between sacrificial layer 284 and high-k dielectric layer 282 during an etching process, such that sacrificial layer 284 can be selectively etched with minimal (to no) etching of high-k dielectric layer 282. The material of sacrificial layer 284 is also different than a p-type work function material of a p-type work function layer (e.g., formed later as a portion of the gate electrodes of gate structures 240) to achieve etching selectivity between sacrificial layer 284 and the p-type work function layer during an etching process, such that sacrificial layer 284 can be selectively etched with minimal (to no) etching of the p-type work function layer, and vice versa. The material of sacrificial layer 284 may also be different than a low-k dielectric material to achieve etching selectivity between sacrificial layer 284 and low-k dielectric material, such as that of ILD layer 270, during an etching process, such that sacrificial layer 284 can be selectively etched with minimal (to no) etching of ILD layer 270. In some embodiments, sacrificial layer 284 includes metal and oxygen (and can thus be referred to as a metal oxide layer), such as aluminum and oxygen (e.g., $AlO_x$). In some embodiments, sacrificial layer 284 includes polysilicon. In some embodiments, sacrificial layer 284 includes silicon. In some embodiments, sacrificial layer 284 includes a dielectric material that includes silicon, such as $SiO_2$, SiN, SiON, other suitable dielectric material including silicon, or combinations thereof. The present disclosure contemplates sacrificial layer 284 including other semiconductor materials and/or other dielectric materials that can provide the desired etching selectivity as described herein.

Turning to FIGS. 13A-13D, an etching process is performed to partially remove sacrificial layer 284, such that sacrificial layer 284 is patterned into sacrificial (dummy) features 284' between channel layers 215' and between channel layers 215' and substrate 202 in n-type gate regions 240-1 and p-type gate regions 240-2. In some embodiments, the etching process is a wet etching process that uses an etching solution having a high etching selectivity with respect to sacrificial layer 284 relative to high-k dielectric layer 282. In some embodiments, the etching solution exhibits an etching selectivity (i.e., a ratio of an etch rate of sacrificial layer 284 to the etching solution to an etch rate of high-k dielectric layer 282 to the etching solution) of about 10 to about 100. In some embodiments, the etching selectivity is greater than or equal to 100. In some embodiments, the wet etching process implements an $NH_4OH$-based wet etching solution. Parameters of the etching process are controlled (tuned) to remove sacrificial layer 284 from sidewalls of channel layers 215' and from over isolation features 230 with minimal (to no) etching of high-k dielectric layer 282, such as etching temperature, etching solution concentration, etching time, other suitable wet etching parameters, or combinations thereof. For example, an etching time (i.e., how long sacrificial layer 284 is exposed to the ammonia-based wet etching solution) is tuned to remove sacrificial layer 284 along sidewalls of channel layers 215' and along a topmost portion of high-k dielectric layer 282 (i.e., a portion of high-k dielectric layer 282 that is disposed over a top surface of a topmost channel layer 215'). In furtherance of the example, the etching time is further tuned to achieve lateral etching (e.g., along the x-direction and/or the y-direction) of sacrificial layer 284 until a width of the sacrificial features 284' (here, along the x-direction) is less than a sum of the width of channel layers 215' and a thickness of the gate dielectric (here, a sum of the thickness of interfacial layer 282 and the thickness of high-k dielectric layer 282). In some embodiments, a width of sacrificial features 284' is substantially equal to a width of channel layers 215'. Sidewalls of sacrificial features 284' are thus recessed a distance d along the x-direction relative to sidewalls of high-k dielectric layer 282. In some embodiments, distance d is greater than 0, for example, about 0.5 nm to about 5 nm. In some embodiments, sidewalls are not recessed along the x-direction relative to sidewalls of high-k dielectric layer 282, such that distance d is equal to 0.

Turning to FIGS. 14A-14D, sacrificial features 284' are removed from p-type gate regions 240-2 by implementing a lithography process and an etching process. For example, a patterned mask layer 290 having one or more openings 292 is formed over multigate device 200 by the lithography process. Patterned mask layer 290 covers n-type GAA transistor regions, which include n-type gate regions 240-1. Patterned mask layer 290 includes a material that is different than a material of sacrificial features 284' and a material of high-k dielectric layer 282 to achieve etching selectivity during removal of sacrificial features 284'. For example, patterned mask layer 290 includes a resist material (and thus may be referred to as a patterned resist layer and/or a patterned photoresist layer). In some embodiments, patterned mask layer 290 has a multi-layer structure, such as a resist layer disposed over an anti-reflective coating (ARC) layer. The present disclosure contemplates other materials for patterned mask layer 290, so long as etching selectivity is achieved during removal of sacrificial features 284'. In some embodiments, the lithography process includes forming a resist layer over multigate device 200 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer (e.g., patterned mask layer 290) includes a resist pattern that corresponds with the mask, where the patterned resist layer covers the n-type GAA transistor regions, which include n-type gate regions 240-1, and exposes the p-type GAA transistor regions, which include p-type gate regions 240-2. Alternatively, the exposure process can be implemented or replaced by other methods, such as maskless lithography, e-beam writing, ion-beam writing, or combinations thereof.

The etching process then uses patterned mask layer 290 as an etch mask when removing sacrificial features 284' between channel layers 215' and between channel layers 215' and substrate 202, thereby exposing high-k dielectric layer 282 in p-type gate regions 240-2. The etching process essentially re-forms a portion of gaps 277B in p-type gate regions 240-2. In some embodiments, the etching process is a wet etching process that uses an etching solution having a high etching selectivity with respect to sacrificial features 284' relative to high-k dielectric layer 282. In some embodiments, the etching solution exhibits an etching selectivity of about 10 to about 100. In some embodiments, the etching selectivity is greater than or equal to 100. In some embodiments, the wet etching process implements an $NH_4OH$-based wet etching solution. Parameters of the etching process are controlled to ensure complete removal of sacrificial features 284' in p-type gate regions 240-2, such as etching temperature, etching solution concentration, etching time, other suitable wet etching parameters, or combinations thereof. For example, an etching time (i.e., how long sacrificial features 284' are exposed to the ammonia-based wet etching solution) is tuned to completely remove sacrificial features 284' with minimal (to no) etching of high-k dielectric layer 282. In some embodiments, an etching time for completely removing sacrificial features 284' is greater than an etching time for patterning sacrificial layer 284 into sacrificial features 284'. In some embodiments, the etching solution further has an etching selectivity with respect to sacrificial features 284' relative to patterned mask layer 290. In some embodiments, the etching process partially etches patterned mask layer 290. After the etching process, the patterned mask layer 290 can be removed from multigate device 200, for example, by a resist stripping process or other suitable process.

Turning to FIGS. 15A-15D, a p-type work function layer 300 is formed over multigate device 200, particularly over high-k dielectric layer 282. For example, an ALD process conformally deposits p-type work function layer 300 on high-k dielectric layer 282, such that p-type work function layer 300 has a substantially uniform thickness and partially fills gate trenches 275. In p-type gate regions 240-2, p-type work function layer 300 is disposed on high-k dielectric layer 282 and surrounds high-k dielectric layer 282, interfacial layer 280, and channel layers 215'. For example, p-type work function layer 300 is disposed along sidewalls, tops, and bottoms of channel layers 215'. A thickness of p-type work function layer 300 is configured to at least partially fill gaps 277B between channel layers 215' and between channel layers 215' and substrate 202 (and, in some embodiments, without filling gate trenches 275 along the gate length direction (here, along the y-direction)). In some embodiments, p-type work function layer 300 has a thickness of about 1 nm to about 10 nm. In contrast, in n-type gate regions 240-1, p-type work function layer 300 is disposed along sidewalls of channel layers 215' and the top surfaces of the topmost channel layers 215'. Sacrificial features 284' thus function as deposition stop layers, preventing significant deposition of p-type work function layer 300 in gaps 277A between channel layers 215' and between channel layers 215' and substrate 202 in n-type gate regions 240-1. In the depicted embodiment, p-type work function layer 300 is further disposed along sidewalls of sacrificial features 284'. P-type work function layer 300 includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. In the depicted embodiment, p-type work function layer 300 includes titanium and nitrogen, such as TiN. P-type work function layer 300 can be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 16A-16D, p-type work function layer 300 is removed from n-type gate regions 240-1 of gate structures 240, for example, by implementing a lithography process and an etching process. For example, a patterned mask layer 310 having one or more openings 312 is formed over multigate device 200 by the lithography process, such as the lithography process described above to form patterned mask layer 290. Patterned mask layer 310 covers p-type gate regions 240-2 of gate structures 240. Patterned mask layer 310 includes a material that is different than a material of p-type work function layer 300, a material of sacrificial features 284,' and a material of high-k dielectric layer 282 to achieve etching selectivity during removal of p-type work function layer 300. For example, patterned mask layer 310 includes a resist material. In some embodiments, patterned mask layer 310 has a multi-layer structure, such as a resist layer disposed over an ARC layer. The present disclosure contemplates other materials for patterned mask layer 310, so long as etching selectivity is achieved during removal of p-type work function layer 300 from n-type gate regions 240-1.

Any suitable process is then used to completely remove p-type work function layer 300 from n-type gate regions 240-1, thereby exposing high-k dielectric layer 282 in n-type gate regions 240-1. In some embodiments, the etching process is a wet etching process that uses an etching solution having a high etching selectivity with respect to p-type work function layer 300 relative to high-k dielectric layer 282 and sacrificial features 284'. In some embodiments, the etching solution exhibits an etching selectivity (i.e., a ratio of an etch rate of p-type work function layer 300 to the etching solution to an etch rate of high-k dielectric layer 282 (and/or sacrificial features 284') to the etching solution) of about 10 to about 100. In some embodiments, the etching selectivity is greater than or equal to 100. In some embodiments, the wet etching process implements a wet etching solution that includes $NH_4OH$, HCl, and diazine ($N_2H_2$) (in other words, an $NH_4OH:HCl:N_2H_2$ solution). Parameters of the etching process are controlled (tuned) to remove p-type work function layer 300 with minimal (to no) etching of high-k dielectric layer 282 and/or sacrificial features 284', such as etching temperature, etching solution concentration, etching time, other suitable wet etching parameters, or combinations thereof. In some embodiments, the wet etching solution includes $NH_4OH$, hydrogen peroxide ($H_2O_2$), sulfuric acid ($H_2SO_4$), tetramethylammonium hydroxide (TMAH), HCl, other suitable wet etching solution, or combinations thereof. For example, the wet etching solution can utilize an $NH_4OH:H_2O_2$ solution, an $HCl:H_2O_2:H_2O$ solution (known as an hydrochloric-peroxide mixture (HPM)), an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some embodiments, a dry etching process or combination of a dry etching process and a wet etching process is implemented for removing p-type work function layer 300. After the etching process, the patterned mask layer 310 can be removed from multigate device 200, for example, by a resist stripping process or other suitable process.

In some embodiments, the etching process is not an over etching process, which generally refers to an etching process that is performed for a longer time than a required, expected etching time to remove a given material. In conventional GAA gate replacement processes, an over etching process is often required to completely remove p-type work function layer 300 from n-type gate regions 240-1, particularly from between channel layers 215' and between channel layers 215' and substrate 202. However, it has been observed that the over etching process may undesirably laterally etch a portion of the p-type work function layer 300 in p-type gate regions 240-2 underneath patterned mask layer 310 at a boundary 315 between n-type gate regions 240-2 and p-type gate regions 240-2 (often referred to as an n/p boundary or mixed threshold voltage boundary). One solution to mitigate the metal gate lateral loss at boundary 315 is to limit a thickness of the p-type work function layer 300, which limits threshold voltage tuning of the p-type GAA transistors. The proposed GAA gate replacement process overcomes such problems by forming sacrificial features 284' between channel layers 215' and between channel layers 215' and substrate 202 in n-type gate regions 240-1 before forming p-type work function layers of the gate electrodes. This eliminates the need for an over etching process to remove p-type work function layers from between channel layers 215' and between channel layers 215' and substrate 202 in n-type gate regions 240-2, such as p-type work function layer 300, and allows for thicker p-type work function layers in p-type gate regions 240-2, increasing threshold voltage tuning flexibility for p-type GAA transistors and avoiding unintended increases in the threshold voltages of p-type GAA transistors. For example, in some embodiments, the etching time of the etching process for removing p-type work function layer 300 is not configured to ensure removal of p-type work function material between channel layers 215' and between channel layers 215' and substrate 202 in n-type gate regions 240-1. Different embodiments may have different advantages, and no particular advantage is necessarily required of any embodiment.

The processes described with reference to FIGS. 15A-15D and FIGS. 16A-16D can be referred to as a p-type work function layer deposition/etch cycle, which the present disclosure proposes repeating until the gate dielectric and the p-type work function layer completely fill the gate trenches 275 along the gate length direction in p-type gate regions 240-2 of gate structures 240. For example, in FIG. 15D and FIG. 16D, gate trenches 275 in p-type gate regions 240-2 are not completely filled along the gate length direction by interfacial layer 282, high-k dielectric layer 284, and p-type work function layer 300. Additional p-type work function layer deposition/etch cycles are therefore performed until gate trenches 275 in p-type gate regions 240-2 are completely filled along the gate length direction by interfacial layer 282, high-k dielectric layer 284, and a p-type work function layer (including p-type work function layer 300). In some embodiments, p-type work function layer deposition/etch cycles are performed until a thickness T of the combined p-type work function layers is greater than or equal to about half of the gate length (i.e., $T \geq L_g$), where thickness T is defined between sidewalls of high-k dielectric layer 282 and sidewalls of the p-type work function layer (both of which are disposed along sidewalls of channel layers 215'). Completely filling gate trenches 275 in p-type gate regions 240-1 along the gate length direction ensures that subsequently formed n-type work function layers are formed above the gate structures 240 (in particular, over gate spacers 247) along the gate length direction, such that p-type gate regions 240-2 do not include remnants of n-type work function layers along the gate length direction, which can adversely alter desired threshold voltages of p-type GAA transistors of p-type gate regions 240-2. Different embodiments may have different advantages, and no particular advantage is necessarily required of any embodiment.

Turning to FIGS. 17A-17D, a p-type work function layer 320 is formed over multigate device 200, particularly over high-k dielectric layer 282 in n-type gate regions 240-1 of gate structures 240 and over p-type work function layer 300 in p-type gate regions 240-2 of gate structures 240. For example, an ALD process conformally deposits p-type work function layer 320 on high-k dielectric layer 282 and p-type work function layer 300, such that p-type work function layer 320 has a substantially uniform thickness and partially fills gate trenches 275 along the gate length direction in n-type gate regions 240-1 and completely fills any remaining portions of gate trenches along the gate length direction in p-type gate regions 240-2. In p-type gate regions 240-2, p-type work function layer 320 is disposed on p-type work function layer 300 and surrounds p-type work function layer 300, high-k dielectric layer 282, interfacial layer 280, and channel layers 215'. For example, p-type work function layer 320 is disposed along sidewalls, tops, and bottoms of channel layers 215'. A thickness of p-type work function layer 320 is configured to fill any remaining portions of gaps 277B between channel layers 215' and between channel layers 215' and substrate 202. In some embodiments, p-type work function layer 320 has a thickness of about 1 nm to about 10 nm. In the depicted embodiment, thickness T (i.e., a sum of a thickness of p-type work function layer 300 and a thickness of p-type work function layer 320) is greater than or equal to about half of the gate length (i.e., T≥$L_g$). In some embodiments, thickness T is about 2 nm to about 20 nm. In contrast, in n-type gate regions 240-1 of gate structures 240, p-type work function layer 320 is disposed along sidewalls of channel layer 215' and the top surface of the topmost channel layer 215'. Sacrificial features 284' thus again function as deposition stop layers, preventing significant deposition of p-type work function layer 320 between channel layers 215' and between channel layers 215' and substrate 202 in n-type gate regions 240-1. In the depicted embodiment, p-type work function layer 320 is disposed along sidewalls of sacrificial features 284'. P-type work function layer 320 includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. In the depicted embodiment, p-type work function layer 320 includes titanium and nitrogen, such as TiN. P-type work function layer 320 can be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 18A-18D, p-type work function layer 320 is removed from n-type gate regions 240-1 of gate structures 240, for example, by implementing a lithography process and an etching process. For example, a patterned mask layer 330 having one or more openings 332 is formed over multigate device 200 by the lithography process, such as the lithography process described above to form patterned mask layer 330 covers p-type gate regions 240-2 of gate structures 240. Patterned mask layer 330 includes a material that is different than a material of p-type work function layer 320, a material of sacrificial features 284,' and a material of high-k dielectric layer 282 to achieve etching selectivity during removal of p-type work function layer 320. For example, patterned mask layer 330 includes a resist material. In some embodiments, patterned mask layer 330 has a multi-layer structure, such as a resist layer disposed over an ARC layer. The present disclosure contemplates other materials for patterned mask layer 330, so long as etching selectivity is achieved during removal of p-type work function layer 320 from n-type gate regions 240-1. Any suitable process, such as the etching processes described above for removing p-type work function layer 300, is then used to completely remove p-type work function layer 320 from n-type gate regions 240-1, thereby exposing high-k dielectric layer 282 in n-type gate regions 240-1. In some embodiments, patterned mask layer 330 may intentionally or unintentionally (e.g., resulting from overlay shift associated with the lithography process) cover a portion of n-type gate regions 240-1 at boundary 315 as depicted in FIG. 18B. This results in the p-type work function layer having different thicknesses (e.g., along the z-direction) at boundary 315, such as a thickness t3 and a thickness t4. In some embodiments, a difference between thickness t4 (e.g., a sum of the thickness of p-type work function layer 300 and the thickness of p-type work function layer 320) and thickness t3 (substantially equal to the thickness of p-type work function layer 300) is greater than or equal to about 1 nm. After the etching process, the patterned mask layer 330 can be removed from multigate device 200, for example, by a resist stripping process or other suitable process.

Turning to FIGS. 19A-19D, sacrificial features 284' are removed from n-type gate regions 240-1 of gate structures 240 by implementing an etching process. In the depicted embodiment sacrificial features 284' are removed from between channel layers 215' and between channel layers 215' and substrate 202, thereby exposing high-k dielectric layer 282 in n-type gate regions 240-1. The etching process essentially re-forms a portion of gaps 277A in in n-type gate regions 240-1. In some embodiments, the etching process is a wet etching process that uses an etching solution having a high etching selectivity with respect to sacrificial features 284' relative to high-k dielectric layer 282 and p-type work function layer 330. In some embodiments, the etching solution exhibits an etching selectivity of about 10 to about 100. In some embodiments, the etching selectivity is greater than or equal to 100. In some embodiments, the wet etching process implements an $NH_4OH$-based wet etching solution. Parameters of the etching process are controlled to ensure complete removal of sacrificial features 284' in n-type gate regions 240-1, such as etching temperature, etching solution concentration, etching time, other suitable wet etching parameters, or combinations thereof. For example, an etching time (i.e., how long sacrificial features 284' are exposed to the ammonia-based wet etching solution) is tuned to completely remove sacrificial features 284' with minimal (to no) etching of high-k dielectric layer 282 and p-type work function layer 330. In some embodiments, an etching time for completely removing sacrificial features 284' is greater than an etching time for patterning sacrificial layer 284 into sacrificial features 284'. In some embodiments, an etching time for completely removing sacrificial features 284' from between channel layers 215' and from between channel layers 215' and substrate 202 is greater than an etching time that would be required to remove a material of sacrificial features 284' from over portions of the gate dielectric layer disposed over ILD layer 270, gate spacers 247, and/or isolation features 230. The etching process can thus be configured as an over etching process to ensure complete removal of sacrificial features 248. Etching solutions implemented for the over etching process are configured to have high etching selectivity to sacrificial features 284' relative to p-type work function layers 300, 320 to reduce (or eliminate) concerns of lateral loss of p-type work function layers 300, 320 in p-type gate regions 240-2 at boundary 315. In some embodiments, the etching solution further has an etching selectivity with respect to sacrificial features 284' relative to a patterned mask layer. In some embodiments, the etching process partially removes (etches) patterned mask layer. In some embodiments, patterned mask layer 330 remains over p-type gate regions 240-2 during removal of sacrificial features 284' from n-type gate regions 240-1, and the etching process then uses patterned mask layer 330 as an etch mask. In such embodiments, after the etching process, the patterned mask layer 330 can be removed, for example, by a resist stripping process or other suitable process.

Turning to FIGS. 20A-20D, an n-type work function layer 340 is formed over multigate device 200, particularly over high-k dielectric layer 282 in n-type gate regions 240-1 of gate structures 240 and over p-type work function layer 320 in p-type gate regions 240-2 of gate structures 240. For example, an ALD process conformally deposits n-type work function layer 340 on high-k dielectric layer 282 and p-type work function layer 320, such that n-type work function layer 340 has a substantially uniform thickness and partially fills gate trenches 275 along the gate length direction in n-type gate regions 240-1. In n-type gate regions 240-1, n-type work function layer 340 is disposed on high-k dielectric layer 282 and surrounds n-type work function layer 340, high-k dielectric layer 282, interfacial layer 280, and channel layers 215'. For example, n-type work function layer 340 is disposed along sidewalls, tops, and bottoms of channel layers 215'. In contrast, in p-type gate regions 240-2, because the disclosed gate replacement process ensures that gate trenches 275 are filled (e.g., the gate dielectric (i.e., high-k dielectric layer 282 and interfacial layer 280) and the p-type work function layer (i.e., p-type work function layer 300 and p-type work function layer 320)) along the gate length direction in p-type gate regions 240-2, n-type work function layer 340 is formed over gate structures 240 in p-type gate regions 240-2, in particular, over gate spacers 247. This prevents n-type work function layer 340 or any remnants (residue) thereof from affecting the threshold voltage of the p-type GAA transistors, particularly for short-channel p-type GAA transistors. In the depicted embodiment, a thickness of n-type work function layer 340 completely fills remaining portions of gaps 277B between channel layers 215' and between channel layers 215' and substrate 202 in n-type gate regions 240-1. In some embodiments, n-type work function layer 340 has a thickness of about 1 nm to about 5 nm. In some embodiments, a thickness of n-type work function layer 340 is less than a thickness of the p-type work function layer (i.e., a combined thickness of p-type work function layer 300 and p-type work function layer 320). N-type work function layer 340 includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer 340 includes aluminum. For example, n-type work function layer 340 includes titanium and aluminum, such as TiAl, TiAlC, TaSiAl, or TiSiAlC. Alternatively, n-type work function layer 340 is formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 21A-21D, n-type work function layer 340 is removed from p-type gate regions 240-2 of gate structures 240, for example, by implementing a lithography process and an etching process. For example, a patterned mask layer 345 having one or more openings 347 is formed over multigate device 200 by the lithography process, such as the lithography process described above to form patterned mask layer 290. Patterned mask layer 345 covers n-type gate regions 240-1 of gate structures 240. Patterned mask layer 345 includes a material that is different than a material of n-type work function layer 340 to achieve etching selectivity during removal of n-type work function layer 340. For example, patterned mask layer 345 includes a resist material. In some embodiments, patterned mask layer 345 has a multi-layer structure, such as a resist layer disposed over an ARC layer. The present disclosure contemplates other materials for patterned mask layer 345, so long as etching selectivity is achieved during removal of n-type work function layer 340 from n-type gate regions 240-1. Any suitable process, such as the etching processes described herein, is then used to completely remove n-type work function layer 340 from p-type gate regions 240-2, thereby exposing p-type work function layer 320 in p-type gate regions 240-2. After the etching process, the patterned mask layer 345 can be removed from multigate device 200, for example, by a resist stripping process or other suitable process.

Turning to FIGS. 22A-22D, a metal fill (or bulk) layer 350 is formed over multigate device 200, particularly over n-type work function layer 340 in n-type gate regions 240-1 and over p-type work function layer 320 in p-type gate regions 240-2. For example, a CVD process or a PVD process deposits metal fill layer 350 on n-type work function layer 340 and p-type work function layer 320, such that metal fill layer 350 fills any remaining portion of gate trenches 275, including any remaining portions of gaps 277A in n-type gate regions 240-1. Metal fill layer 350 includes a suitable conductive material, such as Al, W, and/or Cu. Metal fill layer 350 may additionally or collectively include other metals, metal oxides, metal nitrides, other suitable materials, or combinations thereof. In some implementations, a blocking layer is optionally formed over n-type work function layer 340 and p-type work function layer 320 before forming metal fill layer 350, such that metal fill layer 350 is disposed on the blocking layer. For example, an ALD process conformally deposits the blocking layer on n-type work function layer 340 and p-type work function layer 320, such that the blocking layer has a substantially uniform thickness and partially fills gate trenches 275. The blocking layer includes a material that blocks and/or reduces diffusion between gate layers, such as metal fill layer 350 and n-type work function layer 340 and/or p-type work function layers 300, 320. Alternatively, metal fill layer 350 and/or the blocking layer are formed using another suitable deposition process, such as ALD, CVD, PVD, HDPCVD, MOCVD, RPCVD, PECVD, LPCVD, ALCVD, APCVD, spin coating, plating, other deposition process, or combinations thereof.

Turning to FIGS. 23A-23D, a planarization process is performed to remove excess gate materials from multigate 200. For example, a CMP process is performed until a top surface of ILD layer 270 is reached (exposed), such that a top surface of gate structures 240 are substantially planar with a top surface of ILD layer 270 after the CMP process. In the depicted embodiment, gate structures 240 are thus configured with two different metal gate portions—n-metal gates 360A in n-type gate regions 240-1 and p-metal gates 360B in p-type gate regions 240-2. Metal gates 360A include a gate dielectric (e.g., interfacial layer 280 and high-k dielectric layer 282) and a gate electrode (e.g., n-type work function layer 340 and metal fill layer 350). Metal gates 360B include a gate dielectric (e.g., interfacial layer 280 and high-k dielectric layer 282) and a gate electrode (e.g., a p-type work function layer 362 (e.g., p-type work function layer 300 and p-type work function layer 320) and metal fill layer 350). Accordingly, multigate device 200 includes n-type GAA transistors having metal gates 360A wrapping respective channel layers 215', such that metal gates 360A are disposed between respective epitaxial source/drain features 260A, and p-type GAA transistors having metal gates 360B wrapping respective channel layers 215', such that metal gates 360B are disposed between respective epitaxial source/drain features 260B.

Fabrication can proceed to continue fabrication of multigate device 200. For example, various contacts can be formed to facilitate operation of the n-type GAA transistors and the p-type GAA transistors. For example, one or more ILD layers, similar to ILD layer 270, and/or CESL layers can be formed over substrate 202 (in particular, over ILD layer 270 and gate structures 240). Contacts can then be formed in ILD layer 270 and/or ILD layers disposed over ILD layer 270. For example, contacts are respectively electrically and/or physically coupled with gate structures 240 and contacts are respectively electrically and/or physically coupled to source/drain regions of the n-type GAA transistors and the p-type GAA transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of the MLI feature described above.

The present disclosure provides for many different embodiments. An exemplary method forming a gate dielectric layer in a gate trench in a gate structure. The gate dielectric layer is formed around first channel layers in a p-type gate region and around second channel layers in an n-type gate region. The method further includes forming a p-type work function layer in the gate trench over the gate dielectric layer in the p-type gate region and the n-type gate region. In some embodiments, the p-type work function layer completely fills the gate trench along a gate length direction. Sacrificial features are formed between the second channel layers in the n-type gate region before forming the p-type work function layer and the sacrificial features are removed between the second channel layers in the n-type gate region after removing the p-type work function layer from the gate trench in the n-type gate region. In some embodiments, removing the sacrificial features between the second channel layers in the n-type gate region includes performing an etching process that selectively etches the sacrificial features without substantially etching the p-type work function layer. In some embodiments, p-type work function layer is removed from the gate trench in the n-type gate region by performing an etching process that selectively etches the p-type work function layer without substantially etching the gate dielectric layer and the sacrificial features. The method further includes forming an n-type work function layer in the gate trench over the gate dielectric layer in the n-type gate region. The n-type work function layer surrounds the gate dielectric layer and the second channel layers in the n-type gate region. The method further includes forming a metal fill layer in the gate trench over the p-type work function layer in the p-type gate region and the n-type work function layer in the n-type gate region. In some embodiments, the n-type work function layer is also formed in the gate trench over the p-type work function layer in the p-type gate region. In such embodiments, the n-type work function layer is disposed above gate spacers of the gate structure and the gate trench is free of the n-type work function layer along a gate length of the gate trench in the p-type gate region. In such embodiments, the n-type work function layer is removed from the gate trench in the p-type gate region before forming the metal fill layer.

In some embodiments, forming the sacrificial features in the gate trench between the second channel layers in the n-type gate region include forming a sacrificial layer over the gate dielectric layer in the gate trench. The sacrificial layer and the gate dielectric layer fill gaps between the first channel layers in the p-type gate region and the gate dielectric layer and the sacrificial layer fill gaps between the second channel layers in the n-type gate region. The sacrificial layer is then patterned to form sacrificial features between the first channel layers in the p-type gate region and between the second channel layers in the n-type gate region. The sacrificial features are removed from between the first channel layers in the p-type gate region. In some embodiments, removing the sacrificial features from between the first channel layers in the p-type gate region includes performing a lithography process to form a patterned mask layer that covers the n-type gate region and exposes the p-type gate region, and performing an etching process to remove the sacrificial features in the p-type gate region. The etching process can use the patterned mask layer as an etch mask.

In some embodiments, forming the p-type work function layer includes forming a first p-type work function layer in the gate trench over the gate dielectric layer in the p-type gate region and the n-type gate region, and forming a second p-type work function layer in the gate trench over the first p-type work function layer in the p-type gate region and over the gate dielectric layer in the n-type gate region. In such embodiments, removing the p-type work function layer from the gate trench in the n-type gate region includes removing the first p-type work function layer from the gate trench in the n-type gate region before forming the second p-type work function layer and removing the second p-type work function layer from the gate trench in the n-type gate region. In some embodiments, the first p-type work function layer is removed from the gate trench in the n-type gate region by performing a first lithography process and a first etching process, where the first lithography process forms a mask layer that covers the p-type gate region. In some embodiments, the second p-type work function layer is removed from the gate trench in the n-type gate region by performing a second lithography process and a second etching process, where the second lithography process forms a mask layer that covers the p-type gate region and a portion of the n-type gate region at a boundary of the p-type gate region and the n-type gate region.

Another exemplary method includes depositing a gate dielectric layer over first semiconductor layers in a p-type gate region and over second semiconductor layers in an n-type gate region, wherein the gate dielectric layer wraps the first semiconductor layers and the second semiconductor layers. The first semiconductor layers have first gaps therebetween and the second semiconductor layers have second gaps therebetween after depositing the gate dielectric layer. The method further includes depositing a sacrificial layer over the gate dielectric layer in the p-type gate region and the n-type gate region and etching the sacrificial layer in the p-type gate region and the n-type gate region to form first sacrificial features in the p-type gate region between the first semiconductor layers and second sacrificial features in the n-type gate region between the second semiconductor layers. The method further includes, after removing the first sacrificial features from the p-type gate region, depositing a p-type work function layer over the gate dielectric layer in the p-type gate region and the n-type gate region. In some embodiments, a material of the sacrificial layer is different than a material of the p-type work function layer. In some embodiments, a thickness (T) of the p-type work function layer is greater than or equal to half a gate length (Lg) (T≥0.5 Lg). The method further includes removing the p-type work function layer from over the gate dielectric layer in the n-type gate region, and after removing the second sacrificial features from the n-type gate region, depositing an n-type work function layer over the gate dielectric layer in the n-type gate region.

In some embodiments, etching the sacrificial layer, removing the first sacrificial features from the p-type gate region, and removing the second sacrificial features from the n-type gate region each include performing a wet etching process that selectively etches the sacrificial layer without substantially etching the gate dielectric layer. The wet etching process may utilize an etching ammonium hydroxide based etching solution. An etching time of the wet etching process for etching the sacrificial layer is less than an etching time of the wet etching process for removing the first sacrificial features from the p-type gate region and removing the second sacrificial features from the n-type gate region. In some embodiments, the etching the p-type work function layer includes performing a wet etching process that selectively etches the p-type work function layer without substantially etching the gate dielectric layer. The wet etching process can utilize an ammonium hydroxide/hydrogen chloride/diazine based etching solution.

An exemplary multigate device includes first channel layers disposed in a p-type gate region over a substrate and second channel layers disposed in an n-type gate region over the substrate. A gate stack spans the p-type gate region and the n-type gate region. The gate stack is disposed between first epitaxial source/drain features disposed in the p-type gate region and second epitaxial source/drain features disposed in the n-type gate region. The gate stack includes a p-metal gate in the p-type gate region that surrounds the first channel layers. The p-metal gate includes a gate dielectric layer, a p-type work function layer disposed over the gate dielectric layer, and a metal fill layer disposed over the p-type work function layer. The gate stack further includes an n-metal gate in the n-type gate region that surrounds the second channel layers. The n-metal gate includes the gate dielectric layer, an n-type work function layer disposed over the gate dielectric layer, and the metal fill layer disposed over the n-type work function layer. A thickness (T) of the p-type work function layer is greater than or equal to half a gate length (Lg) of the gate stack (T≥0.5 Lg). In some embodiments, the p-type work function layer has a first thickness and a second thickness in a boundary region between the p-metal gate and the n-metal gate, where a difference between the first thickness and the second thickness is greater than or equal to about 1 nm. In some embodiments, the thickness of the p-type work function layer is greater than a thickness of the n-type work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multigate device comprising:
first channel layers disposed in a p-type gate region over a substrate;
second channel layers disposed in an n-type gate region over the substrate; and
a gate stack that spans the p-type gate region and the n-type gate region, wherein the gate stack is disposed between first epitaxial source/drain features disposed in the p-type gate region and second epitaxial source/drain features disposed in the n-type gate region, and further wherein the gate stack includes:
   a p-metal gate in the p-type gate region, wherein the p-metal gate surrounds the first channel layers and the p-metal gate includes a gate dielectric layer, a p-type work function layer disposed over the gate dielectric layer, and a metal fill layer disposed over the p-type work function layer,
   an n-metal gate in the n-type gate region, wherein the n-metal gate surrounds the second channel layers and the n-metal gate includes the gate dielectric layer, an n-type work function layer disposed over the gate dielectric layer, and the metal fill layer disposed over the n-type work function layer, and
   wherein a thickness (T) of the p-type work function layer is greater than or equal to half a gate length (Lg) of the gate stack (T≥0.5 Lg).

2. The multigate device of claim 1, wherein the p-type work function layer has a first thickness and a second thickness in a boundary region between the p-metal gate and the n-metal gate and the first thickness is less than the second thickness.

3. The multigate device of claim 2, wherein a difference between the first thickness and the second thickness is greater than or equal to about 1 nm.

4. The multigate device of claim 2, wherein at the boundary region, the n-type work function layer is disposed over the p-type work function layer having the first thickness.

5. The multigate device of claim 2, further comprising an isolation feature disposed over the substrate, wherein the boundary region is disposed over the isolation feature.

6. The multigate device of claim 1, wherein:
first spacings between the first channel layers are filled by the gate dielectric layer and the p-type work function layer; and
second spacings between the second channel layers are filled by the gate dielectric layer and the n-type work function layer.

7. The multigate device of claim 1, wherein a thickness of the p-type work function layer is greater than a thickness of the n-type work function layer.

8. The multigate device of claim 1, wherein the gate length is less than 250 nm.

9. The multigate device of claim 1, wherein the gate dielectric layer includes an interfacial layer and a high-k dielectric layer over the interfacial layer.

10. A multigate device comprising:
a first semiconductor layer over a p-type doped region of a substrate;
a second semiconductor layer over an n-type doped region of the substrate;
a gate stack around the first semiconductor layer and the second semiconductor layer, wherein the gate stack includes:
   a gate dielectric layer having a first portion over the first semiconductor layer, a second portion over the second semiconductor layer, and a third portion over the p-type doped region and the n-type doped region of the substrate, an n-type work function layer between the first portion of the gate dielectric layer and the third portion of the gate dielectric layer, wherein the first portion of the gate dielectric layer, the n-type work function layer, and the third portion of the gate dielectric layer fill a gap between the first semiconductor layer and the p-type doped region of the substrate, and a p-type work function layer between the second portion of the gate dielectric layer and the third portion of the gate dielectric layer, wherein the second portion of the gate dielectric layer, the p-type work function layer, and the third portion of the gate dielectric layer fill a gap between the second semiconductor layer and the n-type doped region of the substrate; and an isolation feature between the p-type doped region of the substrate and the n-type doped region of the substrate, wherein the third portion of the gate dielectric layer is over the isolation feature, the n-type work function layer is over the isolation feature, and the p-type work function layer is over the isolation feature.

11. The multigate device of claim 10, wherein a portion of the n-type work function layer over the isolation feature overlaps a portion of the p-type work function layer over the isolation feature.

12. The multigate device of claim 10, wherein a first portion of the p-type work function layer over the isolation feature has a first thickness, a second portion of the p-type work function layer over the isolation feature has a second thickness, and the first thickness is less than the second thickness.

13. The multigate device of claim 12, wherein the n-type work function layer is over the first portion of the p-type work function layer.

14. The multigate device of claim 10, wherein a gate length of the gate stack is about 5 nm to about 250 nm.

15. The multigate device of claim 10, wherein the p-type work function layer includes a first p-type work function layer and a second p-type work function layer.

16. The multigate device of claim 15, wherein the first p-type work function layer and the second p-type work function layer include a same material.

17. The multigate device of claim 10, wherein a thickness (T) of the p-type work function layer is greater than or equal to half a gate length (Lg) (T≥0.5 Lg) of the gate stack.

18. A multigate device comprising:
a first semiconductor layer disposed over a first substrate extension;
a second semiconductor layer disposed over a second substrate extension;
an isolation feature disposed between the first substrate extension and the second substrate extension; and
a gate stack that includes:
a gate dielectric layer extending over the first substrate extension, the isolation feature, and the second substrate extension, wherein the gate dielectric layer surrounds the first semiconductor layer and the second semiconductor layer,
a n-type work function layer extending over the first substrate extension and over a first portion of the isolation feature, wherein the n-type work function layer surrounds the first semiconductor layer,
a p-type work function layer extending over the second substrate extension and over a second portion of the isolation feature, wherein the p-type work function layer surrounds the second semiconductor layer, wherein a thickness (T) of the p-type work function layer is greater than or equal to half a gate length (Lg) of the gate stack (T≥0.5 Lg), and
a metal fill layer extending over the first substrate extension, the isolation feature, and the second substrate extension, wherein the metal fill layer wraps the n-type work function layer and the p-type work function layer.

19. The multigate device of claim 18, wherein the thickness of the p-type work function layer varies over the isolation feature.

20. The multigate device of claim 18, wherein:
the gate dielectric layer and the n-type work function layer fill a gap between the first semiconductor layer and the first substrate extension; and
the gate dielectric layer and the p-type work function layer fill a gap between the second semiconductor layer and the second substrate extension.

* * * * *